(12) United States Patent
Saito et al.

(10) Patent No.: US 7,508,015 B2
(45) Date of Patent: Mar. 24, 2009

(54) SEMICONDUCTOR DEVICE USING A NITRIDE SEMICONDUCTOR

(75) Inventors: Wataru Saito, Kanagawa (JP); Ichiro Omura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 249 days.

(21) Appl. No.: 11/354,148

(22) Filed: Feb. 15, 2006

(65) Prior Publication Data

US 2006/0138454 A1    Jun. 29, 2006

Related U.S. Application Data

(62) Division of application No. 10/831,130, filed on Apr. 26, 2004, now Pat. No. 7,038,252.

(30) Foreign Application Priority Data

Feb. 27, 2004  (JP)  ............................... 2004-54330

(51) Int. Cl.
*H01L 31/0328* (2006.01)
(52) U.S. Cl. .......................... 257/192; 257/194; 257/20
(58) Field of Classification Search ......... 257/192–198, 257/256, 262, 280, 282–284, 286; 438/285, 438/590
See application file for complete search history.

(56) References Cited

U.S. PATENT DOCUMENTS 6,410,946 B1 *   6/2002   Toyama ...................... 257/194

6,555,851 B2     4/2003   Morizuka
6,933,544 B2 *   8/2005   Saito et al. .................. 257/194

FOREIGN PATENT DOCUMENTS

| JP | 62-171164 | 7/1987 |
|----|-----------|--------|
| JP | 11-261053 | 9/1999 |
| JP | 2004-48058 | 2/2004 |
| WO | WO 03/032397 A2 | 4/2003 |

* cited by examiner

*Primary Examiner*—Steven Loke
*Assistant Examiner*—Thinh T Nguyen
(74) *Attorney, Agent, or Firm*—Oblon, Spivak, McClelland, Maier & Neustadt, P.C.

(57) ABSTRACT

A semiconductor device includes: a first semiconductor layer represented by a composition formula $Al_xGa_{1-x}N$ ($0 \leq x \leq 1$); a first conductivity type or non-doped second semiconductor layer represented by a composition formula $Al_yGa_{1-y}N$ ($0 \leq y \leq 1$, $x < y$) and formed on the first semiconductor layer; a second conductivity type third semiconductor layer represented by a composition formula $Al_xGa_{1-x}N$ ($0 \leq x \leq 1$) and selectively formed on the second semiconductor layer; a gate electrode formed on the third semiconductor layer; a source electrode electrically connected to the second semiconductor layer; and a drain electrode electrically connected to the second semiconductor layer. The distance between the drain electrode and the third semiconductor layer is longer than the distance between the source electrode and the third semiconductor layer.

4 Claims, 18 Drawing Sheets

WB1>WB2
WB1>WB3

WB1>WB2
WB1>WB3

SEMICONDUCTOR DEVICE USING A NITRIDE SEMICONDUCTOR

CROSS REFERENCE TO RELATED APPLICATION

This application is a divisional application of Ser. No. 10/831,130, filed Apr. 26, 2004 and is based upon and claims the benefit of priority under 35 U.S.C. §119 to Japanese Patent Application No. 2004-54330, filed on Feb. 27, 2004; the entire contents of which are incorporated herein by reference.

BACKGROUND OF THE INVENTION

1. Field of the Invention

The present invention relates to a semiconductor device, for example, to an insulating gate type field effect transistor using a nitride semiconductor.

2. Related Background Art

Since a nitride semiconductor device using gallium nitride (hereinafter referred to simply as GaN) has a large band gap as compared with a semiconductor device using silicon (Si), the semiconductor device has a high critical electric field, and from this characteristic, a small-sized device having a high breakdown voltage is easily realized. Accordingly, in a semiconductor for electric power control, a low on-resistance is achieved, and a device having a low loss can be realized. Above all, in a field effect transistor using an AlGaN/GaN heterostructure (hereinafter referred to simply as an HFET (a heterostructure field effect transistor), satisfactory characteristics can be expected with a simple device structure. A gate electrode in AN HFET has a Schottky gate structure forming a Schottky junction with an AlGaN layer. Moreover, a conventional GaN-based HFET is a normally on-type device in which a current flows between a source and a drain, when a drain voltage is applied at a gate voltage of zero.

However, in general, the Schottky gate structure has a problem that a leak current increases, when a gate leak current is large and device temperature rises. A normally-on type device has a problem that a large current flows at the moment at which a power to a circuit is turned on, and this sometimes results in destruction of the device.

BRIEF SUMMARY OF THE INVENTION

According to a first aspect of the present invention, there is provided a semiconductor device comprising:

a first semiconductor layer represented by a composition formula $Al_xGa_{1-x}N$ ($0 \leq x \leq 1$);

a first conductivity type or non-doped second semiconductor layer represented by a composition formula $Al_yGa_{1-y}N$ ($0 \leq y \leq 1$, x<y) and is formed on the first semiconductor layer;

a second conductivity type third semiconductor layer represented by a composition formula $Al_xGa_{1-x}N$ ($0 \leq x \leq 1$) and is selectively formed on the second semiconductor layer;

a gate electrode formed on the third semiconductor layer;

a source electrode electrically connected to the second semiconductor layer; and a drain electrode electrically connected to the second semiconductor layer;

wherein the distance between the drain electrode and the third semiconductor layer is longer than the distance between the source electrode and the third semiconductor layer.

According to a second aspect of the present invention, there is provided a semiconductor device comprising:

a first semiconductor layer represented by a composition formula $Al_xGa_{1-x}N$ ($0 \leq x \leq 1$);

a first conductivity type or non-doped second semiconductor layer represented by a composition formula $Al_yGa_{1-y}N$ ($0 \leq y \leq 1$, x<y) and is formed on the first semiconductor layer;

a second conductivity type third semiconductor layer represented by a composition formula $Al_xGa_{1-x}N$ ($0 \leq x \leq 1$) and is selectively formed above the second semiconductor layer;

a gate insulator formed on the third semiconductor layer;

a gate electrode formed on the gate insulator;

a source electrode electrically connected to the second semiconductor layer; and a drain electrode electrically connected to the second semiconductor layer.

According to a third aspect of the present invention, there is provided a semiconductor device comprising:

a first semiconductor layer represented by a composition formula $Al_xGa_{1-x}N$ ($0 \leq x \leq 1$);

a first conductivity type or non-doped second semiconductor layer represented by a composition formula $Al_yGa_{1-y}N$ ($0 \leq y \leq 1$, x<y), formed on the first semiconductor layer and having a concave portion;

a second conductivity type third semiconductor layer represented by a composition formula $Al_xGa_{1-x}N$ ($0 \leq x \leq 1$) and is selectively formed above a bottom surface of the concave portion of the second semiconductor layer;

a gate electrode formed on the third semiconductor layer;

a source electrode electrically connected to the second semiconductor layer; and a drain electrode electrically connected to the second semiconductor layer.

According to a fourth aspect of the present invention, there is provided a semiconductor device comprising:

a first conductivity type or non-doped first semiconductor layer represented by a composition formula $Al_yGa_{1-y}N$ ($0 \leq y \leq 1$, x<y), the first semiconductor layer having a first surface and a second surface opposite to the first surface, and further having a concave portion on the side of the first surface;

a second conductivity type second semiconductor layer represented by a composition formula $Al_xGa_{1-x}N$ ($0 \leq x \leq 1$) and is formed on the second surface of the first semiconductor layer;

a gate electrode formed above a bottom surface of the concave portion of the first semiconductor layer;

a source electrode electrically connected to the first semiconductor layer; and a drain electrode electrically connected to the first semiconductor layer.

DETAILED DESCRIPTION OF THE INVENTION

Figure 1:
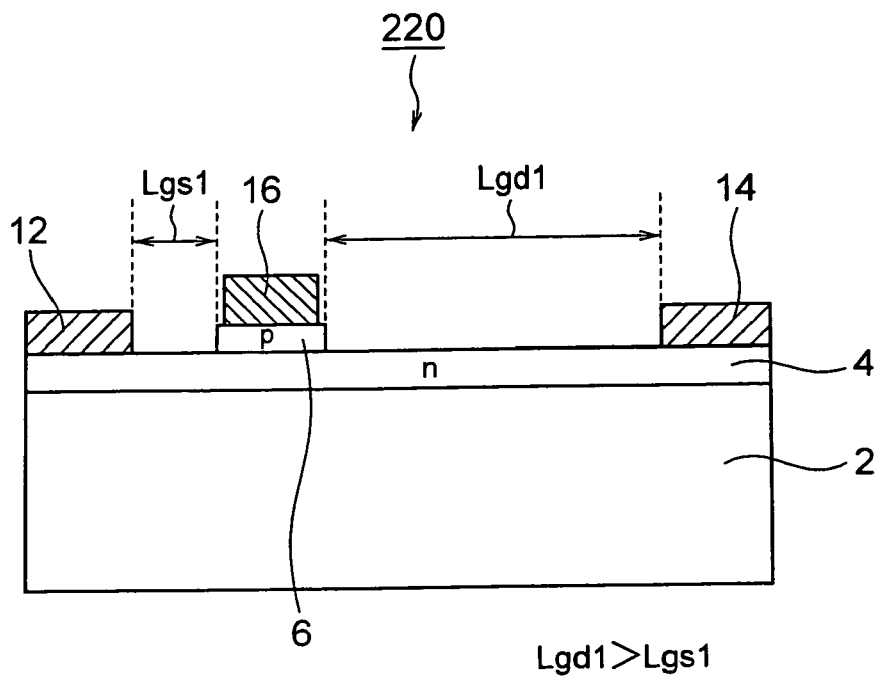
FIG. 1 is a sectional view schematically showing a first embodiment of a semiconductor device according to the present invention.

Several embodiments of the present invention will be described hereinafter with reference to the drawings. In the following description, an n-type is used as a first conductivity type, and a p-type is used as a second conductivity type. Moreover, in the following drawings the same parts are denoted with the same reference numerals and in the following description redundant description will be made only when necessary.

First Embodiment

FIG. 1 is a sectional view schematically showing a first embodiment of a semiconductor device according to the present invention. A GaN heterostructure field effect transistor (hereinafter referred to simply as an HFET) 220 which is shown in FIG. 1 comprises a channel layer 2, an n-type barrier layer 4, a p-type base layer 6, a gate electrode 16, a source electrode 12, and a drain electrode 14. The channel layer 2 is formed of an i-GaN layer, and corresponds to a first semiconductor layer represented by, for example, a composition formula $Al_xGa_{1-x}N$ ($0 \leq x \leq 1$). The n-type barrier layer 4 corresponds to a first conductivity type or non-doped second semiconductor layer represented by, for example, a composition formula $Al_yGa_{1-y}N$ ($0 \leq y \leq 1$, $x<y$), and is formed of an n-AlGaN layer on the channel layer 2 to supply an electron to a channel. Furthermore, the p-type base layer 6 is selectively formed of a p-GaN layer on the n-type barrier layer 4, and corresponds to a third semiconductor layer represented by, for example, the composition formula $Al_xGa_{1-x}N$ ($0 \leq x \leq 1$). It is to be noted that the channel layer 2 is generally formed on a substrate of SiC, sapphire, Si, GaN or the like which are not especially shown in FIG. 1.

The gate electrode 16 is formed on the base layer 6, and both of the source electrode 12 and the drain electrode 14 are formed on the barrier layer 4 so as to contact the barrier layer 4. The source electrode 12 and drain electrode 14 form an ohmic contact with the barrier layer 4, and then an electron flows into the drain electrode 14 from the source electrode 12 via a two-dimensional electron gas (2DEG) channel formed in an AlGaN/GaN hetero interface. These electrodes 12 and 14 can be formed of Ti/Al or the like.

In the HFET 220 of the present embodiment, the base layer 6 and barrier layer 4 form a pn-junction, and therefore a gate leak current is decreased as compared with a Schottky junction.

A gate threshold voltage is determined by a carrier concentration of 2DEG channel. Therefore, to realize a normally-off state, when a gate voltage is zero, a 2DEG carrier concentration is zero, specifically the 2DEG channel has to be depleted. The 2DEG carrier concentration of the AlGaN/GaN heterostructure is determined by a sheet carrier concentration of the barrier layer and a carrier concentration generated by piezo polarization generated by a stress of a hetero interface.

Since the HFET 220 of the present embodiment comprises the base layer 6 formed of GaN on the barrier layer 4, the piezo polarization generated in the hetero interface between the GaN channel layer 2 and the AlGaN barrier layer 4 is canceled by that generated in the hetero interface between the AlGaN barrier layer 4 and the GaN base layer 6. Accordingly, it is possible to selectively reduce the 2DEG carrier concentration of a channel portion.

Moreover, the p-GaN base layer 6 is formed so as to have a sheet impurity concentration which is not less than that of the n-AlGaN barrier layer 4. Accordingly, the 2DEG channel is depleted and the normally-off state is realized.

As shown in FIG. 1, the base layer 6 is formed in a striped shape in the same manner as in the gate electrode 16. Thus, it is possible to set an electron concentration of the channel under the gate electrode 16 to zero when the gate voltage is 0 V, and the normally-off state can be realized.

In the conventional HFET, the normally-off state has been realized by reduction of thickness of the barrier layer 4. However, in this case, the 2DEG carrier concentration of a portion other than the channel also drops, and resistance of an offset portion between gate and source, or between gate and drain. As a result, an on-resistance has increased. On the contrary, in the HFET 220 of the present embodiment it is possible to reduce the 2DEG carrier concentration only in a channel portion since the base layer 6 is selectively formed on the barrier layer 4. As a result, the normally-off state is realized without increasing any on-resistance.

A specific method of selectively forming the base layer 6 includes a method in which a pattern is formed by etching after successive implementation of crystal growth on the channel layer 2, the barrier layer 4 and the base layer 6, and a method in which an insulating film is deposited to form a pattern after performing the crystal growth on the channel layer 2 and the barrier layer 4, and then selective growth.

Furthermore, in the HFET 220 of the present embodiment, the distance between gate and drain Lgd1 is formed to be longer than the distance between gate and source Lgs1. Since the HFET is a horizontal type device, a breakdown voltage of the device is determined by that between gate and drain. To obtain a device with the high breakdown voltage, the distance between gate and drain needs to be lengthened. On the other hand, the distance between gate and source, which may be a cause for a parasitic resistance, is preferably short regardless of the breakdown voltage.

Figure 2:
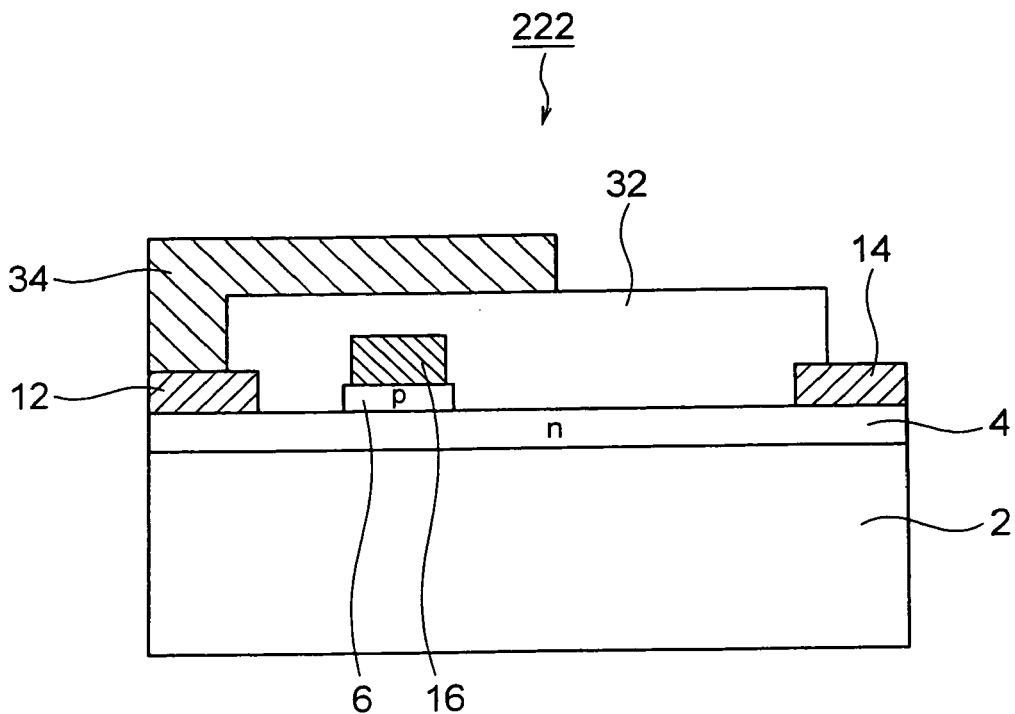
FIG. 2 is a sectional view schematically showing a first modification of the semiconductor device shown in FIG. 1.

Moreover, increase of the breakdown voltage of the device can also be achieved by flattening the distribution of the electronic field between gate and drain. An HFET which is realized by one of the specific means is shown as a first modification of the HFET 220 shown in FIG. 1 in a sectional view of FIG. 2. An HFET 222 comprises a first field plate electrode 34 formed above the gate electrode 16 via a field insulating film 32 so as to cover the gate electrode 16 and connected to the source electrode 12 by a via hole. By this structure, an electric field in an end portion of the gate electrode 16 is defused, and the breakdown voltage increases. It is to be noted that the electric field on the end portion of the gate electrode 16 can be defused even by the connection of the first field plate electrode 34 to the gate electrode 16 without interposing the field insulating film 32. However, in this case, there is a disadvantage that a capacity between gate and drain increases and a switching speed drops.

Figure 3:
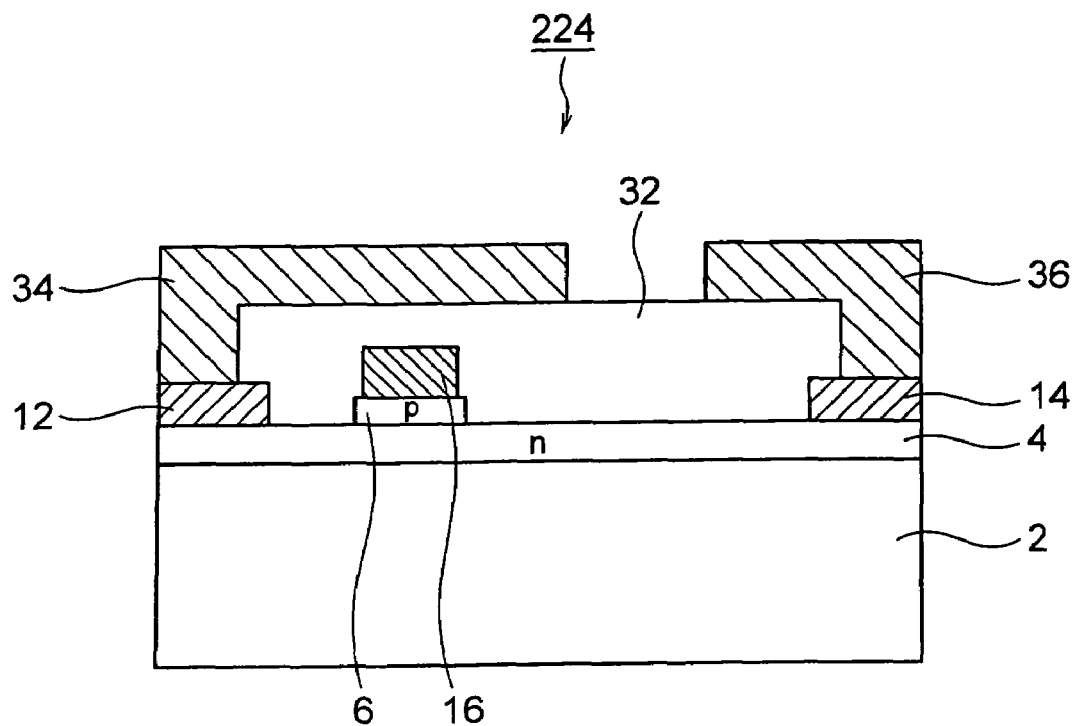
FIG. 3 is a sectional view schematically showing a second modification of the semiconductor device shown in FIG. 1.

A second modification of the HFET 220 shown in FIG. 1 is shown in FIG. 3. An HFET 224 shown in the drawing further comprises a second field plate electrode 36 connected to the drain electrode 14. Thus the electric field in the end portion of the drain electrode 14 is similarly defused, and it is possible to further increase the breakdown voltage.

Second Embodiment

Figure 4:
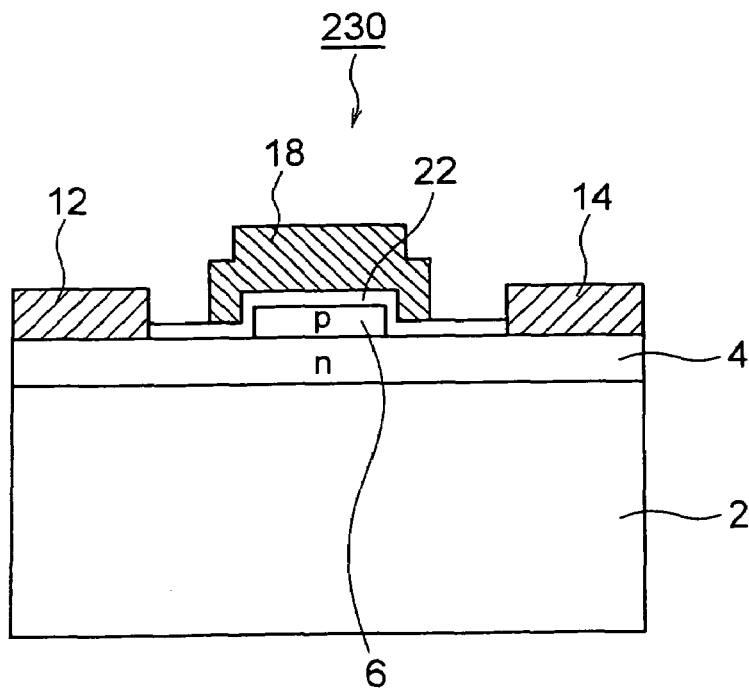
FIG. 4 is a sectional view schematically showing a second embodiment of a semiconductor device according to the present invention.

FIG. 4 is a sectional view schematically showing a second embodiment of a semiconductor device according to the present invention. A GaN insulating gate type heterostructure field effect transistor (hereinafter referred to simply as GaN-MIS-HFET) 230 shown in FIG. 4 further comprises a gate insulating film 22 formed so as to coat the barrier layer 4 and base layer 6, and an insulating gate (MIS gate) structure including a gate electrode 18 formed on the gate insulating film 22 instead of the gate electrode 16 of the GaN-HFET 220 shown in FIG. 1. The gate insulating film 22 can be formed of SiN, SiO2, Al2O3 or the like.

According to the present embodiment, it is possible to set a gate leak current substantially to zero by use of this MIS gate structure.

The other constitution of the GaN-MIS-HFET shown in FIG. 4 is substantially the same as that of the HFET 220 shown in FIG. 1. The 2DEG carrier concentration of the channel under the gate electrode when the gate voltage is 0 V can be set to zero by the base layer 6 formed of GaN in a stripe shape similar to that of the gate electrode 18 in the same manner as in the first embodiment, and the normally-off state can be realized.

Figure 5:
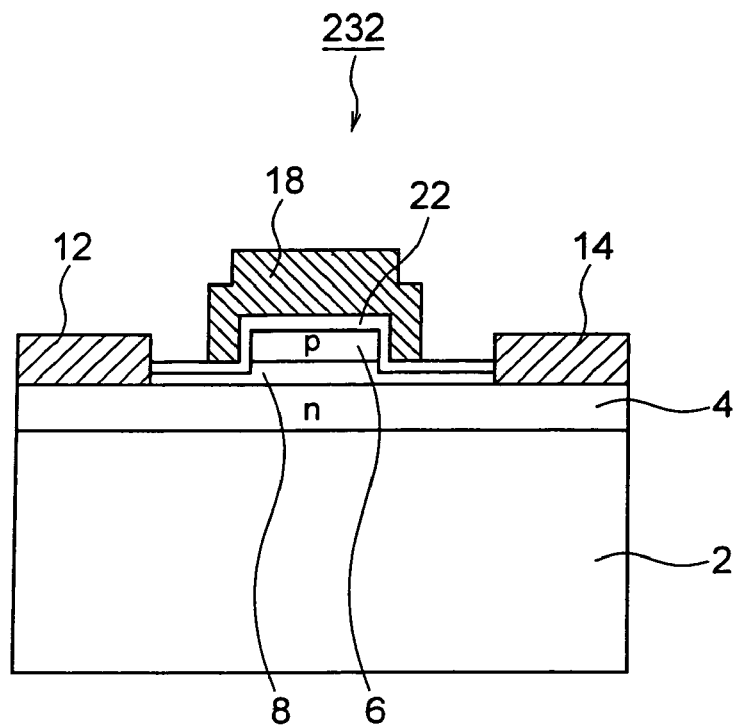
FIG. 5 is a sectional view schematically showing a modification of the semiconductor device shown in FIG. 4.

FIG. 5 shows a modification of a GaN-MIS-HFET 230 shown in FIG. 4. In locally forming the base layer 6 by the etching, even the barrier layer 4 might be etched due to fluctuations in processes. In this case, the 2DEG carrier concentration between the gate and source or between the gate and drain changes, and an on-resistance of the device changes since the thickness of the barrier layer 4 changes due to the etching of the barrier layer 4.

A GaN-MIS-HFET 232 shown in FIG. 5 further comprises a buffer layer 8 which is an i-GaN layer and is formed in a thickness exceeding the fluctuation of an etching depth and which is disposed between the base layer 6 and the barrier layer 4. Thus, it is possible to suppress the fluctuation of the on-resistance by the etching fluctuation. The buffer layer 8 corresponds to, for example, a fourth semiconductor layer, and is formed in the thickness exceeding the fluctuation of the etching depth. The barrier layer 4 is thus not etched. In addition, the sheet carrier concentration in the channel does not change even when the thickness of the buffer layer 8 changes. Therefore, a constant on-resistance can be obtained.

Third Embodiment

Figure 6:
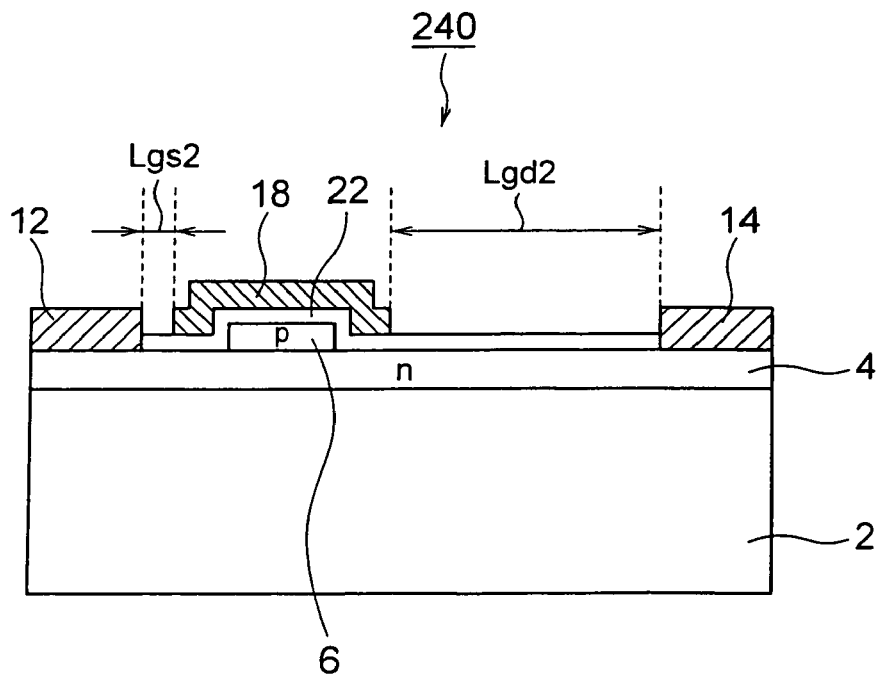
FIG. 6 is a sectional view schematically showing a third embodiment of a semiconductor device according to the present invention.

FIG. 6 is a sectional view schematically showing a third embodiment of a semiconductor device according to the present invention.

In a GaN-MIS-HFET 240 shown in FIG. 6, the interval Lgd between the gate electrode 18 and the drain electrode 14 is set to be larger than the interval Lgs between the gate electrode 18 and the source electrode 12. A high breakdown voltage is required for a power semiconductor device, and the breakdown voltage needs to be held between the gate and drain in the horizontal type device shown in FIG. 6. Therefore, when the distance between the gate and drain is lengthened, the breakdown voltage can be increased.

Figure 7:
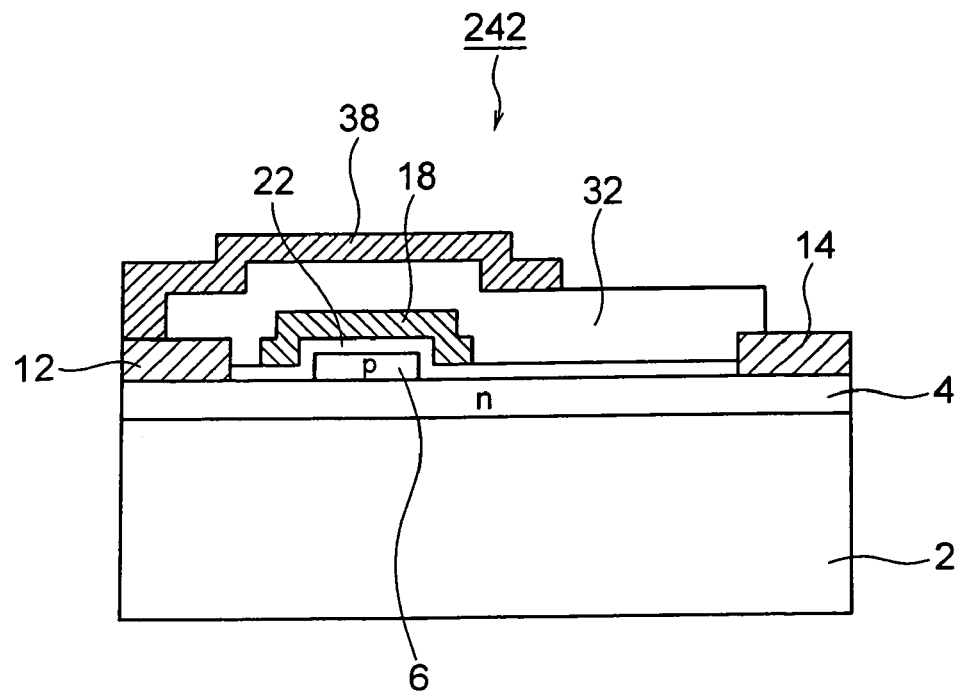
FIG. 7 is a sectional view schematically showing a first modification of the semiconductor device shown in FIG. 6.

FIG. 7 is a sectional view schematically showing a modification of the GaN-MIS-HFET 240 shown in FIG. 6. A GaN-MIS-HFET 242 shown in FIG. 7 further comprises a first field insulating film 32 formed so as to coat the gate electrode, and a field plate electrode 38 formed on the field insulating film 32 and connected to the source electrode 12 by the via hole in order to obtain a higher breakdown voltage. When the gate electrode 18 is covered by the field plate electrode 38, the electric field in the end portion of the gate electrode 18 is defused, and thus the breakdown voltage increases.

Figure 8:
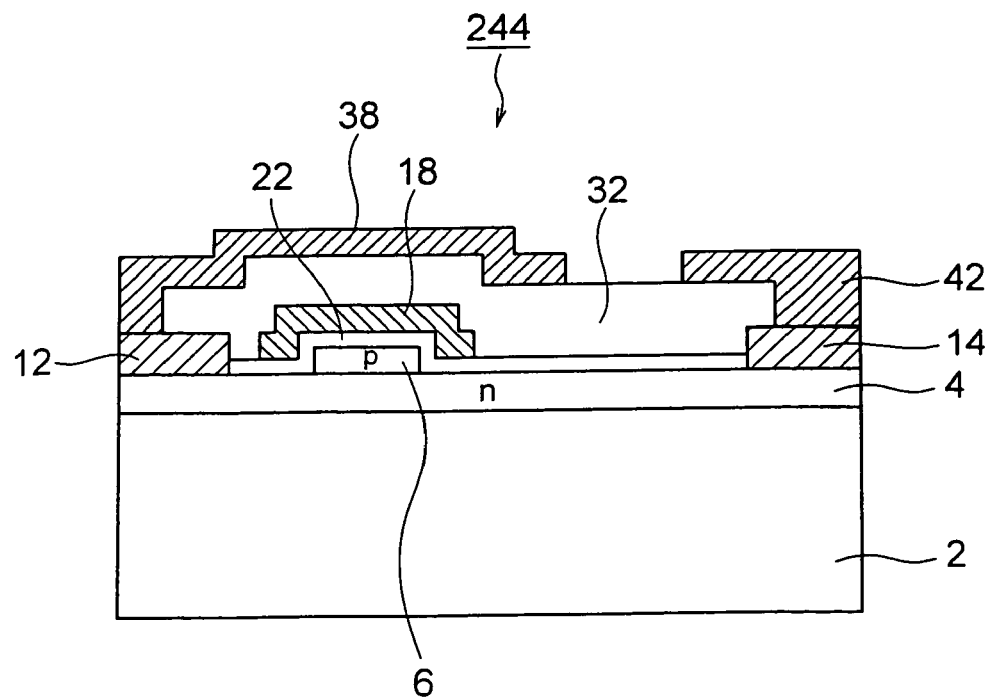
FIG. 8 is a sectional view schematically showing a second modification of the semiconductor device shown in FIG. 6.

FIG. 8 is a sectional view schematically showing a second modification of the GaN-MIS-HFET 240 shown in FIG. 6. A GaN-MIS-HFET 244 shown in FIG. 8 further comprises a second field plate electrode 42 formed on the drain side in order to further increase the breakdown voltage. By this structure, the electric field in the end portion of the drain electrode 14 is defused, and then the breakdown voltage increases. It is to be noted that in the example shown in FIG. 8, the field insulating film 32 is formed in a uniform thickness, but when the thickness is changed in stages, it is possible to further increase the breakdown voltage.

Fourth Embodiment

Figure 9:
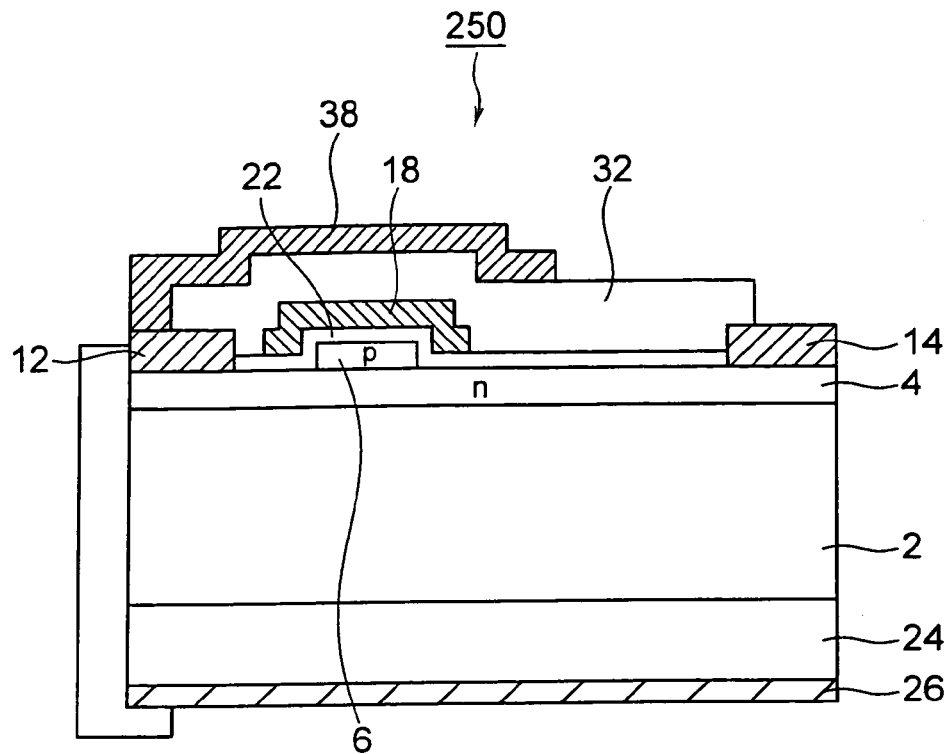
FIG. 9 is a sectional view schematically showing a fourth embodiment of a semiconductor device according to the present invention.

FIG. 9 is a sectional view schematically showing a fourth embodiment of the semiconductor device according to the present invention.

A GaN-MIS-HFET 250 shown in the drawing comprises a channel layer 2 formed by crystal growth on a conductive semiconductor substrate 24, a barrier layer 4 and base layer 6, and a source electrode 12 electrically connected to the conductive semiconductor substrate 24 via a back-surface electrode 26. The substrate 24 is electrically connected to the source electrode 12, and thus functions in the same manner as in the field plate electrode 38 to defuse the electric field in the end portion of the gate electrode 18 or the drain electrode 14, and therefore the breakdown voltage increases. An Si, SiC, or GaN substrate may be used as the conductive semiconductor substrate. In the GaN-MIS-HFET 250 shown in FIG. 9, the back-surface electrode 26 is connected to the source electrode 12 to electrically connect the source electrode 12 to the substrate 24. However, this embodiment is not limited to such a constitution. The source electrode 12 can be connected to the substrate 24 on the same surface as that of the source electrode 12 through, for example, etching of the channel layer 2. A buffer layer for the crystal growth may also be disposed between the conductive semiconductor substrate 24 and the channel layer 2.

Figure 10:
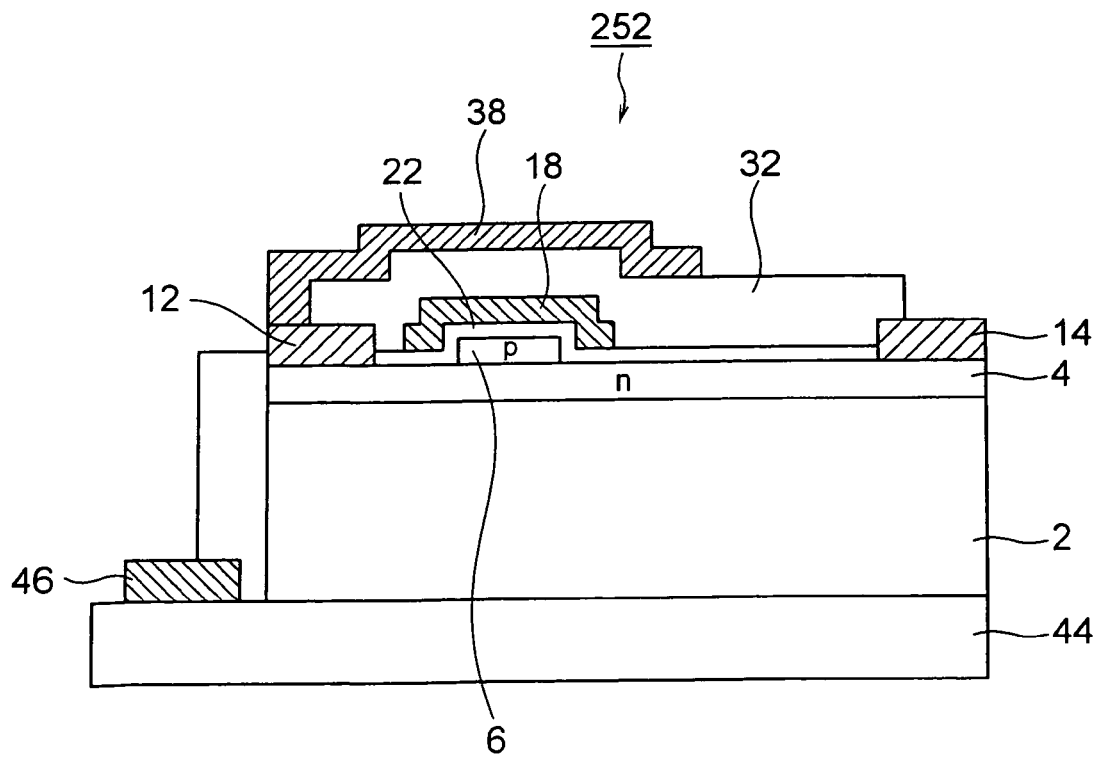
FIG. 10 is a sectional view schematically showing a modification of the semiconductor device shown in FIG. 9.

FIG. 10 is a sectional view schematically showing a modification of the GaN-MIS-HFET 250 shown in FIG. 9. Characteristics of a GaN-MIS-HFET 252 shown in FIG. 10 lie in that the transistor further comprises a hole absorption layer 44 formed of a p-layer having a high concentration on the undersurface of the channel layer 2, and a hole absorption layer 46 formed on the side of the same surface as that of the source electrode 12 in the end portion of the hole absorption layer 44 and that the hole absorption layer 44 is connected to the source electrode 12 via the hole absorption layer 46. The hole absorption layer 46 corresponds to, for example, a fifth semiconductor layer.

According to the present embodiment, when the channel layer 2, barrier layer 4, and base layer 6 are successively formed on the hole absorption layer 44 formed of a p-GaN layer, the breakdown voltage increases, and additionally it is possible to increase an avalanche withstanding capability. In the structures of the HFET shown in FIGS. 1 to 5, when a high drain voltage is applied, and avalanche breakdown occurs, an electron flows into the drain electrode 14, and a hole flows in the gate electrode via the base layer 6. However, a layer which absorbs the hole does not exist in the GaN-MIS-HFET structures shown in FIGS. 6 to 9. Therefore, there may be a disadvantage that the avalanche withstanding capability is reduced.

Since the GaN-MIS-HFET 252 shown in FIG. 10 comprises a hole absorption layer 44 formed in a high-concentration p-layer under the channel layer 2, it is possible to discharge the hole at a low resistance, and it is also possible to increase the avalanche withstanding capability. The hole absorption layer 44 is connected to the source electrode 12 and thus functions as the field plate electrode, and therefore the breakdown voltage further increases. To securely flow the hole into the hole absorption layer 44 at an avalanche breakdown time, the thickness of the channel layer 2 is preferably set to be smaller than a distance Lgd2 between gate and drain. In the example shown in FIG. 10, the hole absorption layer 44 is electrically connected to the source electrode 12 via the hole absorption layer 46 formed on the same surface side as that of the source electrode 12, but an ohmic electrode of the hole absorption layer 44 may also be taken out from the back surface, and the present invention is not limited by a way of taking out the electrode.

It is to be noted that it is possible to increase the avalanche withstanding capability in the HFET structure shown in FIGS. 1 to 5 by additionally disposing the hole absorption layer.

Fifth Embodiment

Figure 11:
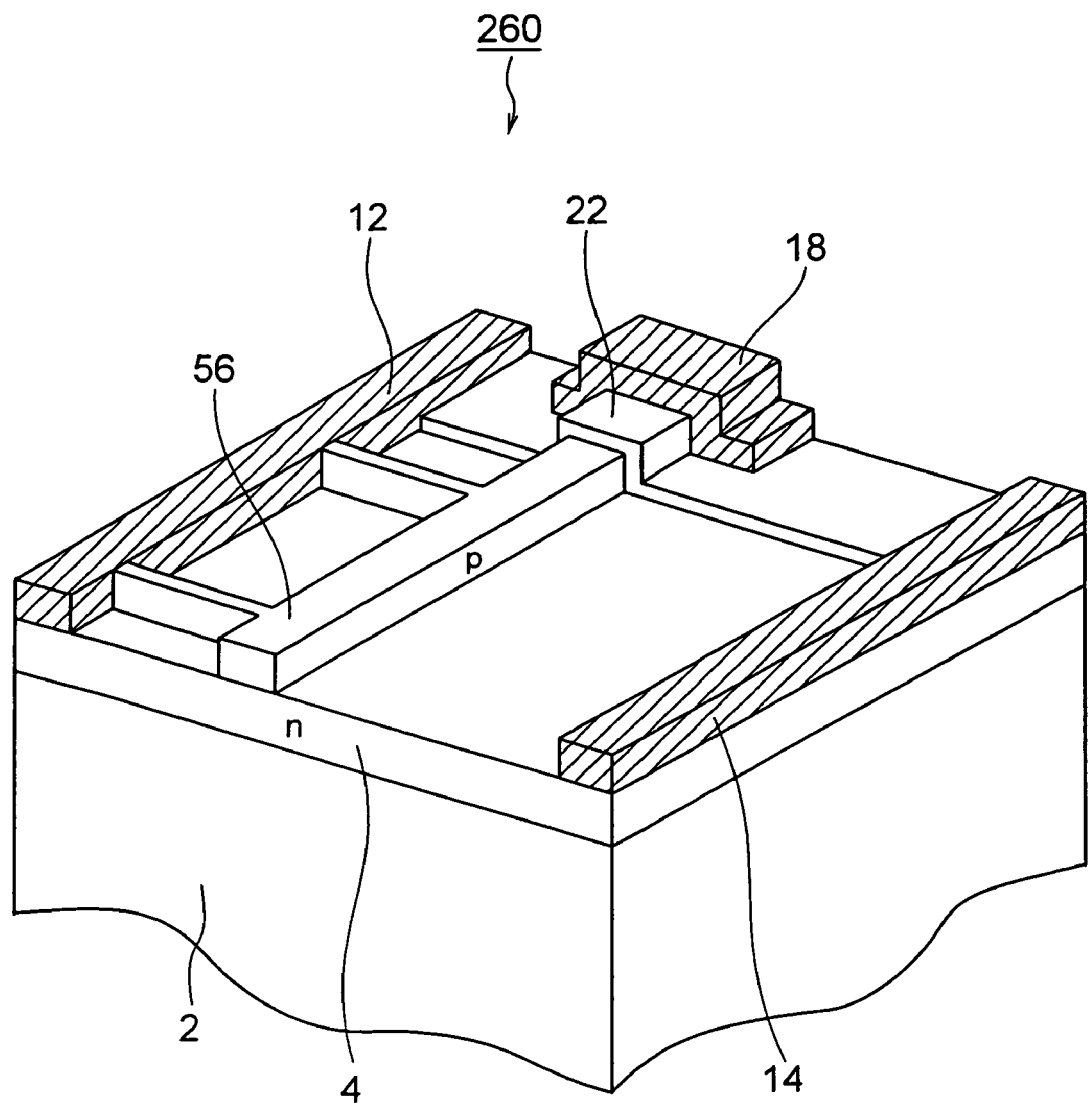
FIG. 11 is a perspective view schematically showing a fifth embodiment of a semiconductor device according to the present invention.

FIG. 11 is a perspective view schematically showing the constitution of the semiconductor device according to a fifth embodiment of the present invention. The characteristics of a GaN-MIS-HFET 260 shown in the drawing lie in that the transistor comprises a base electrode 50 connected to the source electrode 12, and thus a carrier is quickly discharged in a case where the base layer is charged.

Since each of the semiconductor devices shown in FIGS. 6 to 10 has a MIS gate structure, the base layer 6 is not connected to any electrode, and a potential of the base layer 6 has a state similar to that of a floating electrode. Therefore, when the electron is injected into the base layer 6 and the hole is discharged from the base layer 6, the base layer 6 remains to be charged. On the other hand, when the base layer is formed so as to cover the whole surface of a region between the source electrode 12 and the gate electrode 18, a resistance between gate and source increases. A base layer 56 of the GaN-MIS-HFET 260 shown in FIG. 11 has an extended portion formed in the striped shape so that the base layer is locally connected to the source electrode 12 and extends in a direction orthogonal to a longitudinal direction of the source electrode 12 and is connected to the source electrode 12 by this extended portion. A portion of the base layer 56 formed along the longitudinal direction of the source electrode 12 corresponds to, for example, a first stripe portion. The extended portion of the base layer 56 formed in the striped shape in a direction orthogonal to the longitudinal direction of the source electrode 12 corresponds to, for example, a second stripe portion.

Since the base layer 56, barrier layer 4, and channel layer 2 are basically formed in a p-GaN/n-AlGaN/i-GaN heterostructure, any carrier is not injected into the base layer 56 as long as a large voltage is applied to the gate voltage to pass the current by a tunnel effect, but a large voltage is sometimes applied to the gate electrode for certain causes such as a noise at a switching time. According to the present embodiment, since the transistor comprises the base layer 56 having the shape shown in FIG. 11, it is possible to quickly discharge the carrier.

It is to be noted that since the base layer 56 is connected to the source electrode 12, a channel portion is preferably depleted in order to control the potential of the portion by the voltage applied to the gate electrode 18.

Figure 12:
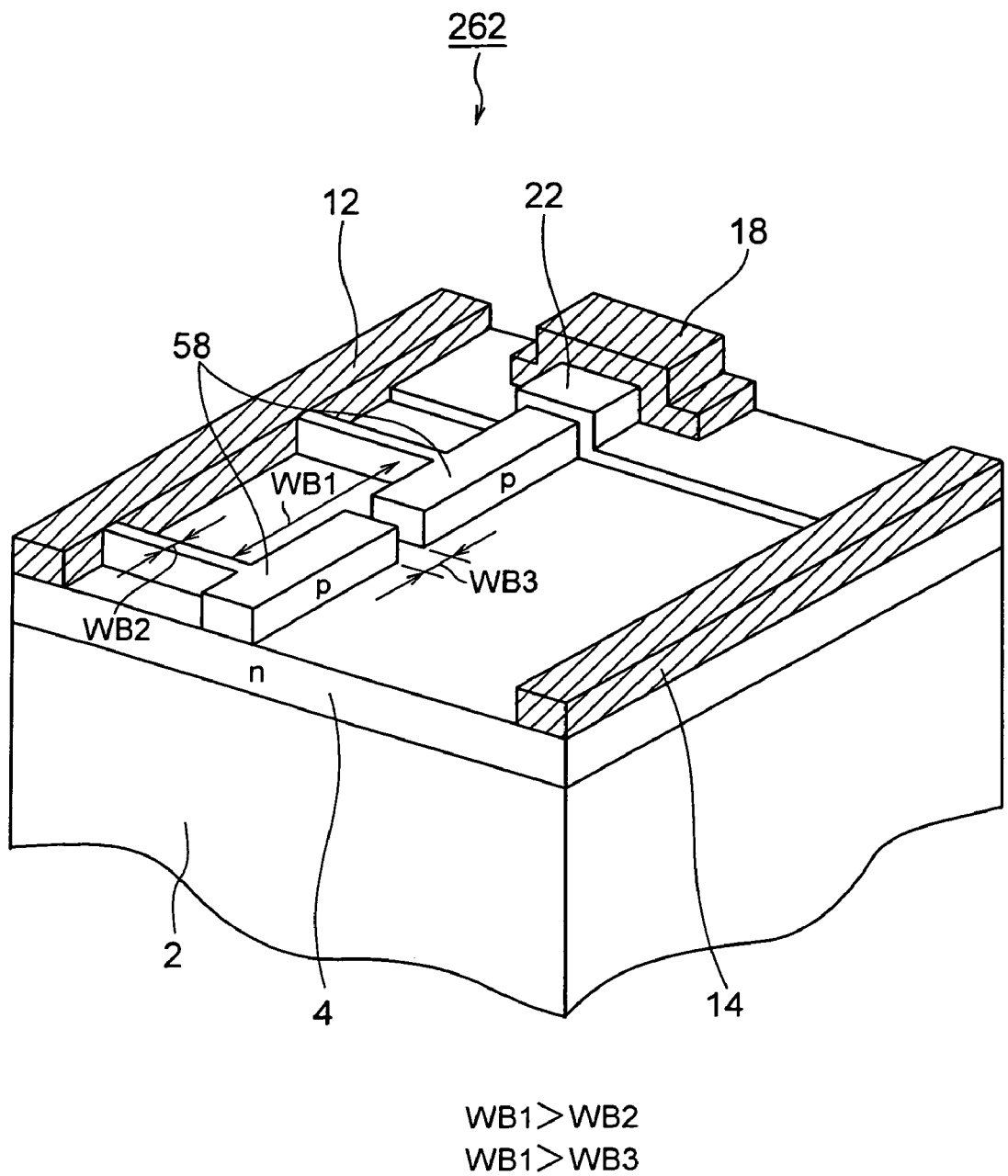
FIG. 12 is a perspective view schematically showing a modification of the semiconductor device shown in FIG. 10.

FIG. 12 shows a modification of the GaN-MIS-HFET 260 shown in FIG. 11. A p-base layer 58 disposed in a GaN-MIS-HFET 262 of the present example is connected to the source electrode 12 in the same manner as in the MIS-HFET 260 of FIG. 11, but a portion of the p-base layer 58 under the gate electrode 18 does not have a continuous striped shape, and is discontinuously formed. This structure can realize a stable gate threshold voltage even in a case where the p-base layer 58 does not have a strictly controlled impurity concentration. When the p-base layer is formed in the continuous shape as the p-base layer 56 shown in FIG. 11, the gate threshold voltage changes dependently on the impurity concentration of the p-base layer 56. Furthermore, the impurity concentration of the p-base layer 56 has to be lowered to a certain degree in order to change the potential of the p-base layer 56 by the gate voltage.

Then, when the p-base layer 58 is discontinuously formed as shown in FIG. 12, a portion in which the p-base layer 58 is not formed selectively forms the channel. In this case, when the impurity concentration of the p-base layer 58 is sufficiently raised, the gate threshold voltage is determined by an interval WB3 between the segmented portions of the p-base layer 58 under the gate electrode 18 which are adjacent to each other, not by the impurity concentration. Moreover, since dimensional precision of the interval WB3 is determined by a dimension system of lithography, the fluctuation is small, and a stable gate threshold voltage can be realized.

The interval WB3 needs to be reduced so that the gate threshold voltage is positive, and the normally-off state is realized. Furthermore, since any channel is not formed in the extended portion of the p-base layer 58 in an offset region between the gate and source, an interval WBI of the extended portion of the p-base layer 58 needs to be broadened in order to secure a broader region of a depletion layer and to lower resistance of the offset region between the gate and source. On the other hand, a width WB2 of the extended portion needs to be reduced. The width WB2 of the extended portion is preferably a half of mutual pitches ((WB1+WB2)/2) or less.

It is to be noted that for the structure shown in FIGS. 11, 12, it is also possible to increase the breakdown voltage by additionally disposing the field plate electrode, and furthermore, it is also possible to enhance the avalanche withstanding capability by adding the hole absorption layer.

Sixth Embodiment

Figure 13:
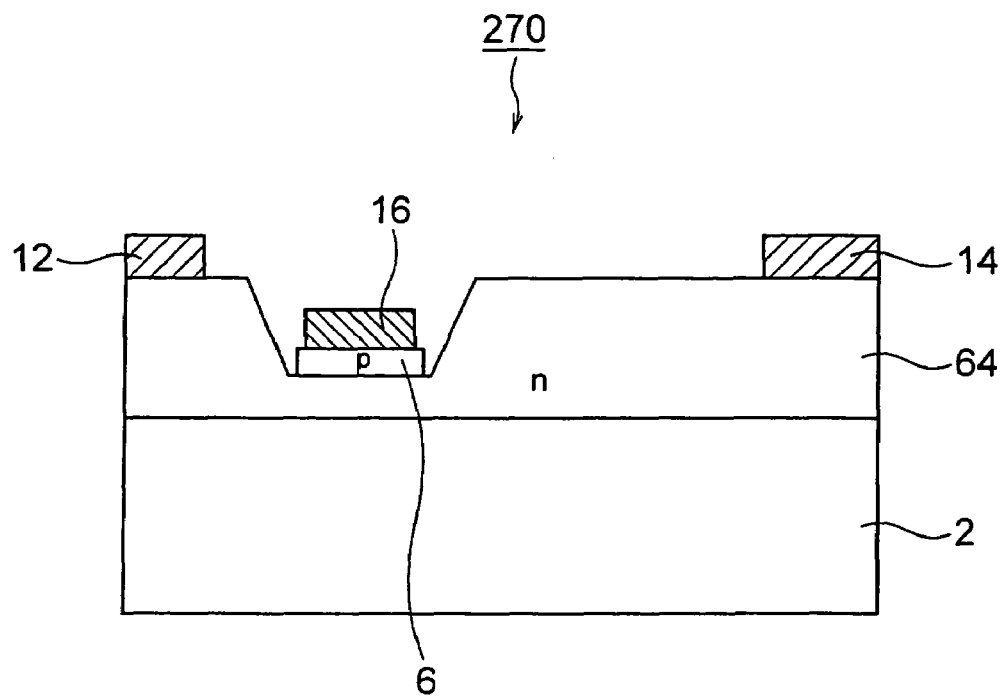
FIG. 13 is a sectional view schematically showing a sixth embodiment of a semiconductor device according to the present invention.

FIG. 13 is a sectional view schematically showing a configuration of a sixth embodiment of the semiconductor device according to the present invention.

The characteristics of an HFET 270 shown in the drawing lie in a recess gate structure comprising a barrier layer 64 formed on the channel layer 2 so that only a region under the gate electrode is thin, and in that the base layer 6 is disposed on the bottom surface of the recess portion of the barrier layer 64. The barrier layer 64 corresponds to, for example, a first conductivity type or non-doped second semiconductor layer, and the base layer 6 corresponds to, for example, a third semiconductor layer. According to the present embodiment, an electron concentration is set to zero only in the channel portion under the gate by locally changing the thickness of the barrier layer 64. Therefore, the normally-off state is realized with the on-resistance remaining to be low.

In order to realize the normally-off state, the electron concentration of the channel layer can be made zero by setting the sheet impurity concentration of the base layer 6 larger than that of the thin portion of the barrier layer 64 under the gate electrode 16, the thin portion determining the electron concentration of the channel. On the other hand, since the electron concentration of the channel layer is not rendered to zero in a thick portion of the barrier layer 64 other than the recess portion thereof, the low on-resistance is realized.

Figure 14:
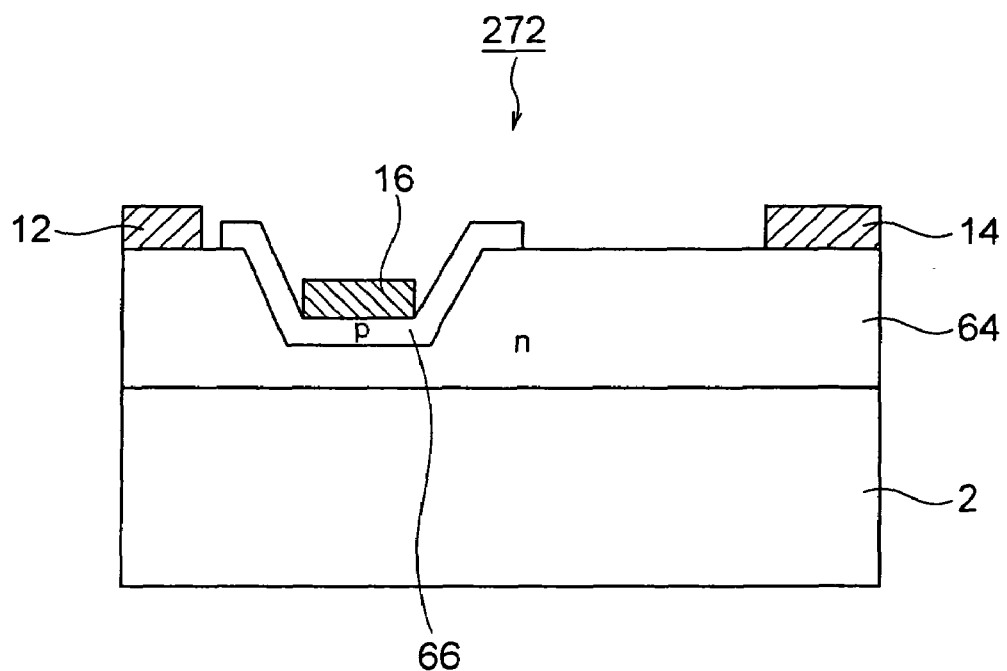
FIG. 14 is a sectional view schematically showing a first modification of the semiconductor device shown in FIG. 13.
Figure 15:
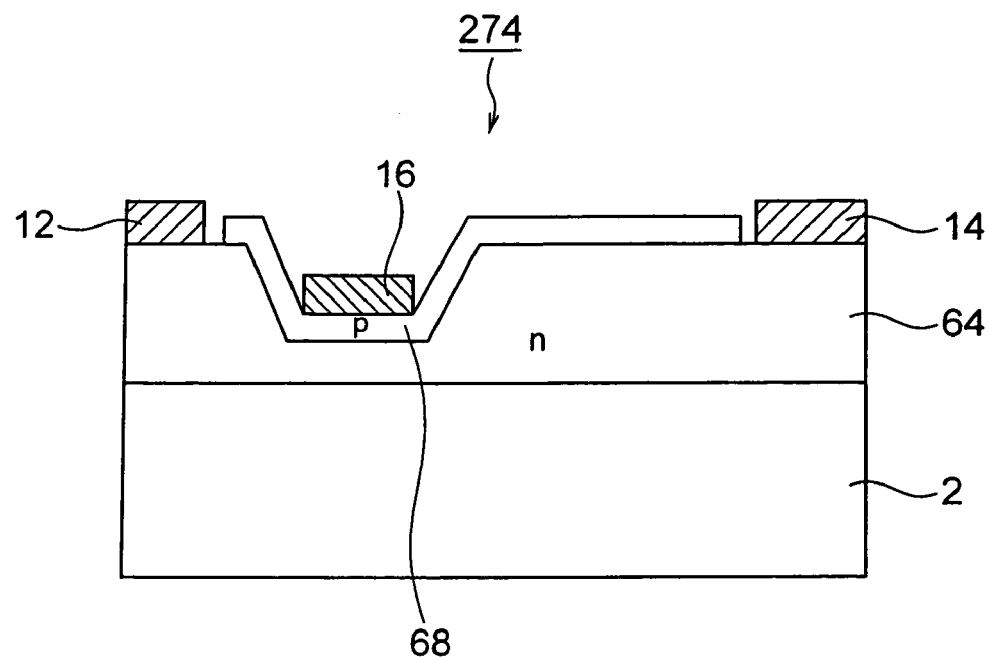
FIG. 15 is a sectional view schematically showing a second modification of the semiconductor device shown in FIG. 13.

FIG. 14 is a sectional view showing a first modification of the HFET 270 shown in FIG. 13. An HFET 272 shown in FIG. 14 comprises a p-base layer 66 formed so as to extend not only to a portion right under the gate electrode 16 in which the barrier layer 64 is formed to be thin but also a portion in which the barrier layer 64 is thickened via the side surface of a recess. In this manner, the p-base layer 66 may also be formed so as to extend to not only the recess bottom surface but also a portion in which the barrier layer 64 is thickened. FIG. 15 is a sectional view showing a second modification of the HFET 270 shown in FIG. 13. An HFET 274 shown in the drawing comprises a base layer 68 extending toward a drain electrode side. The base layer 68 is preferably disposed to be as long as possible to coat the thick portion of the barrier layer 64 up to a region on the verge of the drain electrode 14, and the extended portion is preferably formed so as to coat at least the half or more of the thick portion of the barrier layer 64. By this shape of the base layer 68, the depletion layer of the barrier layer 64 quickly extends toward a drain electrode 14 even in a case where a high voltage is applied to the drain electrode. Accordingly, an effect similar to that of an RESURF layer is obtained, the distribution in electric field between the gate and drain becomes flat, and a higher breakdown voltage can be obtained.

Seventh Embodiment

Figure 16:
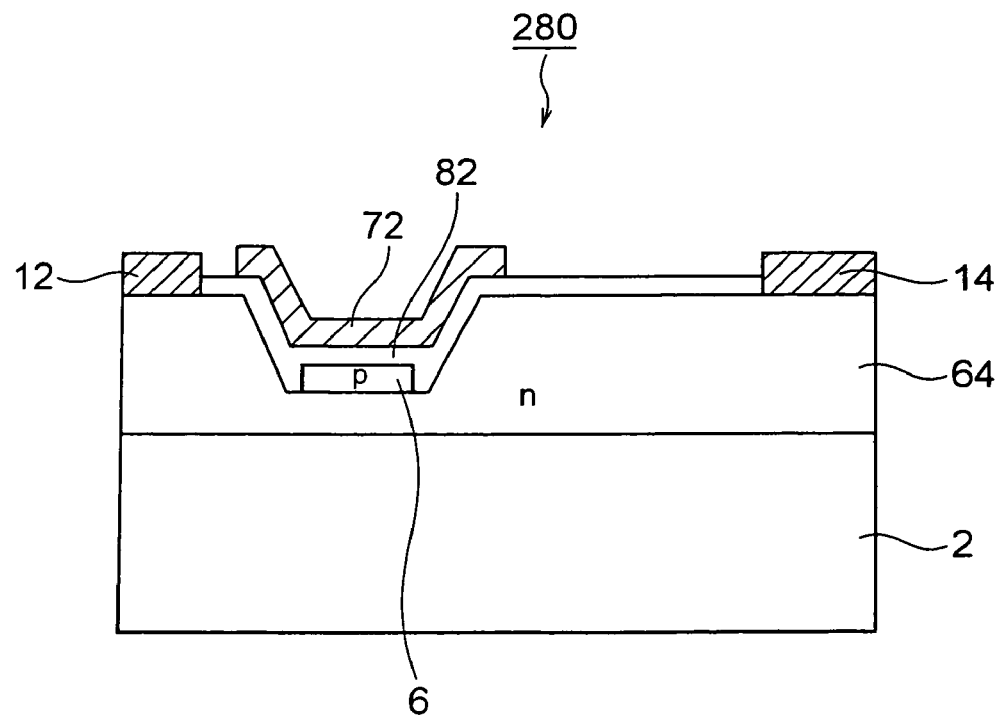
FIG. 16 is a sectional view schematically showing a seventh embodiment of a semiconductor device according to the present invention.

FIG. 16 is a sectional view schematically showing the constitution of a seventh embodiment of the semiconductor device according to the present invention.

A GaN-MIS-HFET 280 shown in the drawing comprises an insulating gate (MIS gate) structure including a gate insulating film 82 formed so as to coat the barrier layer 64 and base layer 6, and a gate electrode 72 formed on the gate insulating film 82 instead of the gate electrode 16 of the HFET 274 shown in FIG. 15.

According to the present embodiment, the gate leak current can be reduced by use of this MIS gate structure. When the sheet impurity concentration of the base layer 6 is set to be larger than that in a thinned region of the barrier layer 64 under the gate electrode 72, the normally-off state can be realized in the same manner as in the structure of the HFET 270 shown in FIG. 13.

Figure 17:
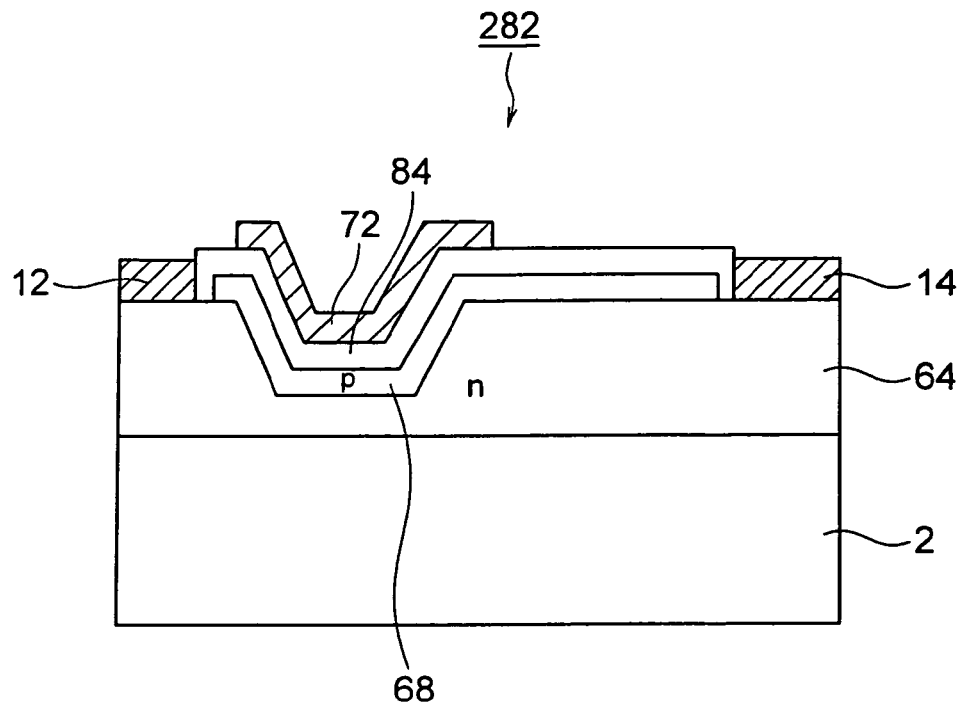
FIG. 17 is a sectional view schematically showing a first modification of the semiconductor device shown in FIG. 16.
Figure 18:
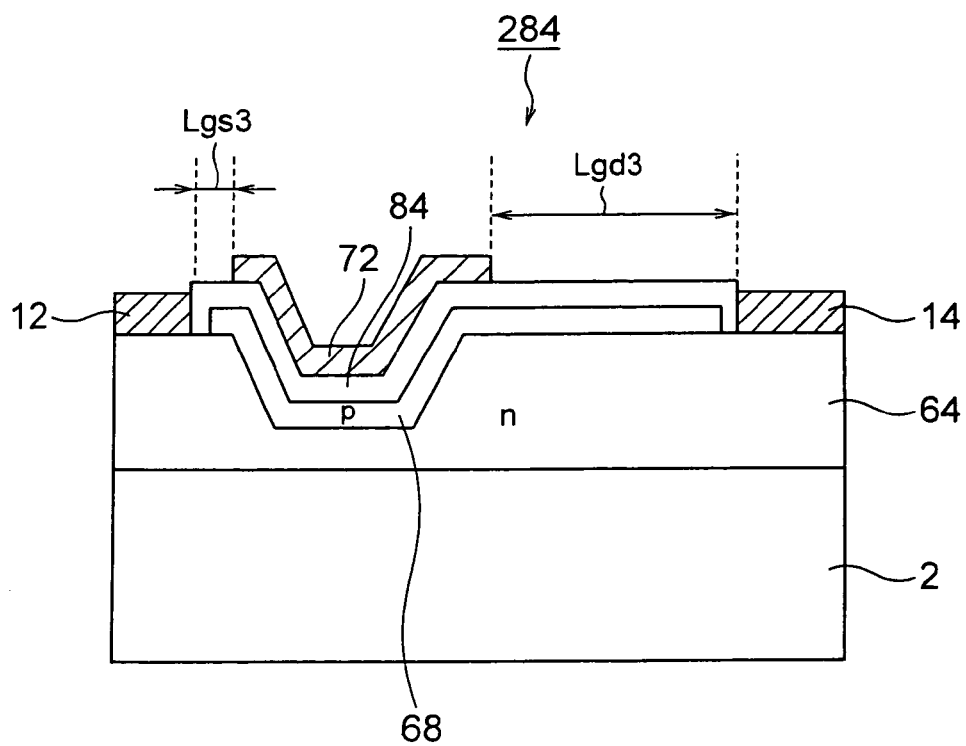
FIG. 18 is a sectional view schematically showing a second modification of the semiconductor device shown in FIG. 16.

FIG. 17 is a sectional view showing a first modification of the GaN-MIS-HFET 280 shown in FIG. 16. As in a GaN-MIS-HFET 282 shown in the drawing, the p-base layer 68 may also be formed so as to extend to the thick portion of the barrier layer 64. The extended portion of the base layer 68 is preferably formed to coat the half or more of the region between the gate electrode 72 and the drain electrode 14 in a surface region of the barrier layer 64. Furthermore, in a second modification shown in FIG. 18, an interval Lgd3 between the gate electrode 72 and the drain electrode 14 is set to be larger than an interval Lgs3 between the gate electrode 72 and the source electrode 12. For a power semiconductor device, a high breakdown voltage is required, and the breakdown voltage needs to be held between the gate and drain in the horizontal type device. According to a GaN-MIS-HFET 284 of the present example, it is possible to increase the breakdown voltage by lengthening the distance between gate and drain.

Figure 19:
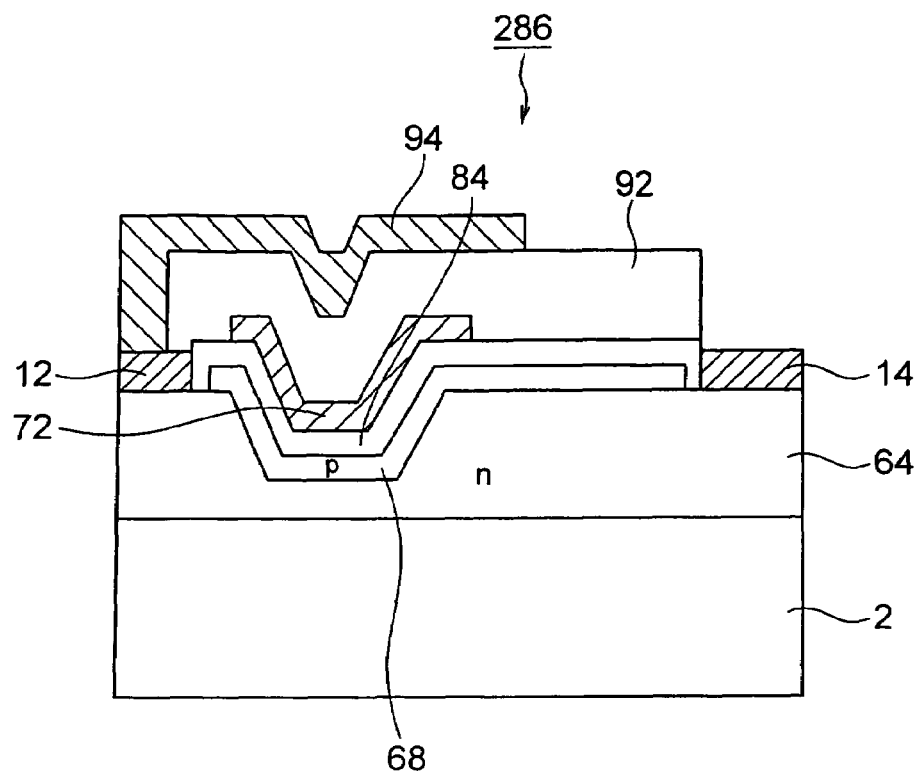
FIG. 19 is a sectional view schematically showing a third modification of the semiconductor device shown in FIG. 16.

FIG. 19 shows a third modification comprising a structure for obtaining a higher breakdown voltage. A GaN-MIS-HFET 286 shown in the drawing comprises a field insulating film 92 formed so as to coat the gate electrode 72, and a field plate electrode 94 formed on this field insulating film 92. Since the gate electrode 72 is covered with the field plate electrode 94 in this manner, the electric field in the end portion of the gate electrode 72 is defused, and the breakdown voltage increases.

Figure 20:
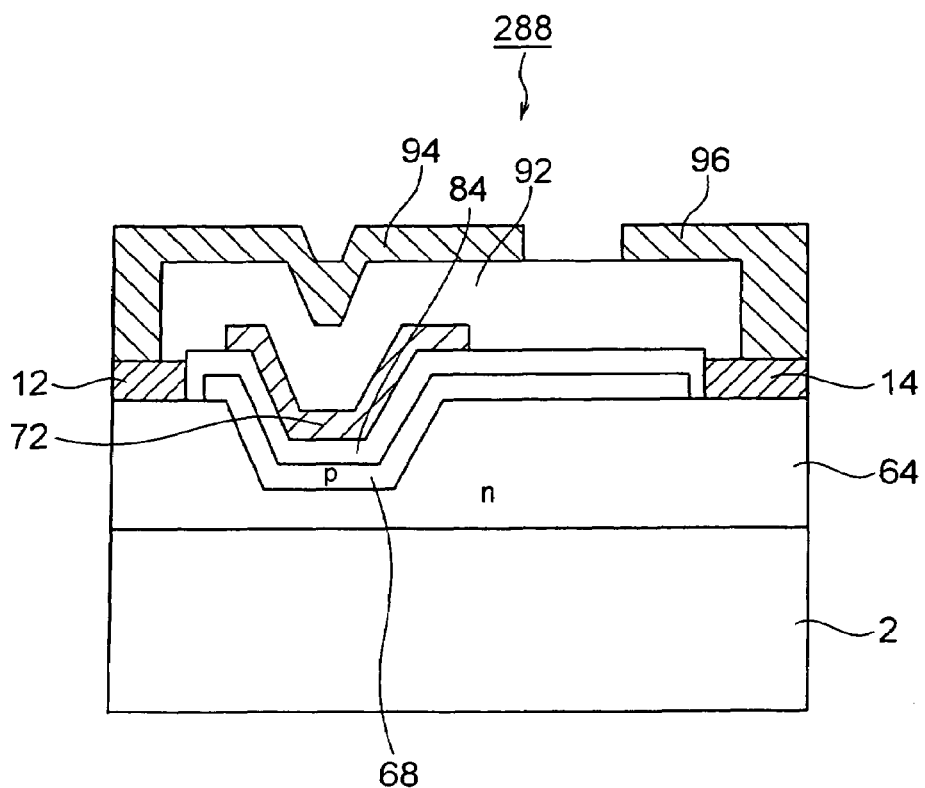
FIG. 20 is a sectional view schematically showing a fourth modification of the semiconductor device shown in FIG. 16.

A fourth modification comprising a structure for further increasing the breakdown voltage is shown in FIG. 20. The characteristics of a GaN-MIS-HFET 288 shown in the drawing lie in that the transistor further comprises a second field plate electrode 96 formed on the drain side of the field insulating film 92. Thus, the electric field in the end portion of the drain electrode 14 is defused, and the breakdown voltage further increases. It is to be noted that in FIG. 20, the field insulating film 92 formed in a uniform thickness is shown, it is possible to further increase the breakdown voltage even when the thickness is changed in stages.

Eighth Embodiment

Figure 21:
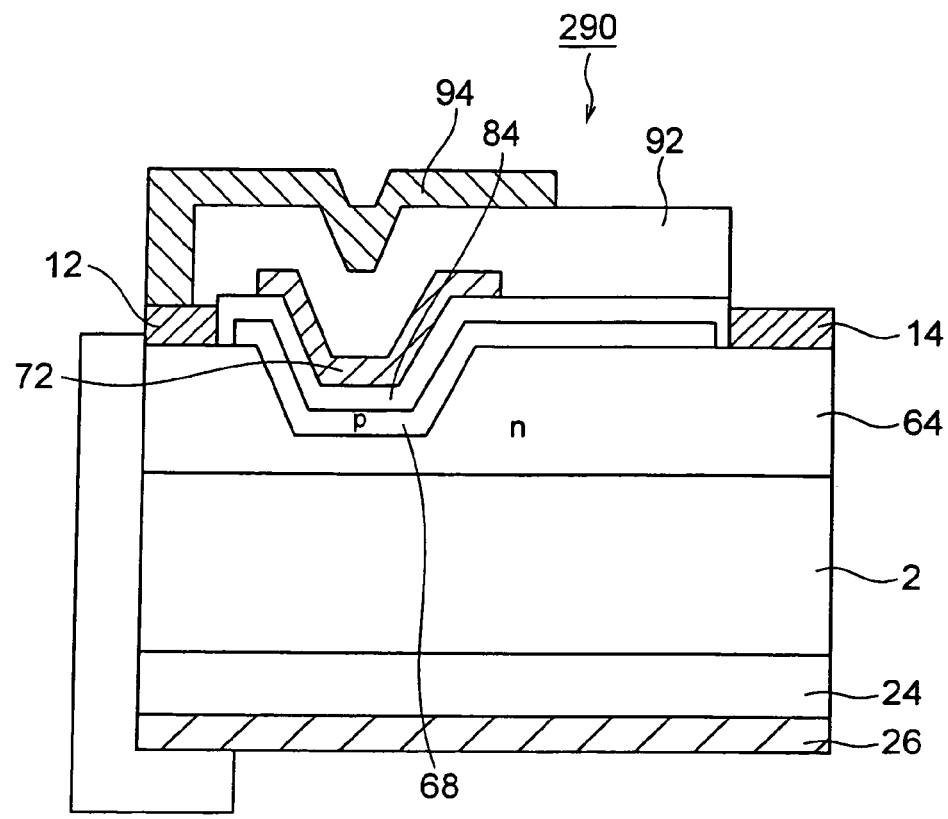
FIG. 21 is a sectional view schematically showing an eighth embodiment of a semiconductor device according to the present invention.

FIG. 21 is a sectional view schematically showing a constitution of an eighth embodiment according to the present invention. The characteristics of a MIS-HFET 290 shown in the drawing lie in that the channel layer 2, the barrier layer 64, and the base layer 68 are formed above the conductive semiconductor substrate 24, and the conductive semiconductor substrate 24 is connected to the source electrode 12 via the back-surface electrode 26. Thus, the substrate 24 functions as a field plate, and the distribution in the electric field between gate and drain approaches a flat distribution, and it is therefore to increase the breakdown voltage. As a result, a breakdown voltage further higher than that of the GaN-MIS-HFET 286 shown in FIG. 19 can be realized.

Figure 22:
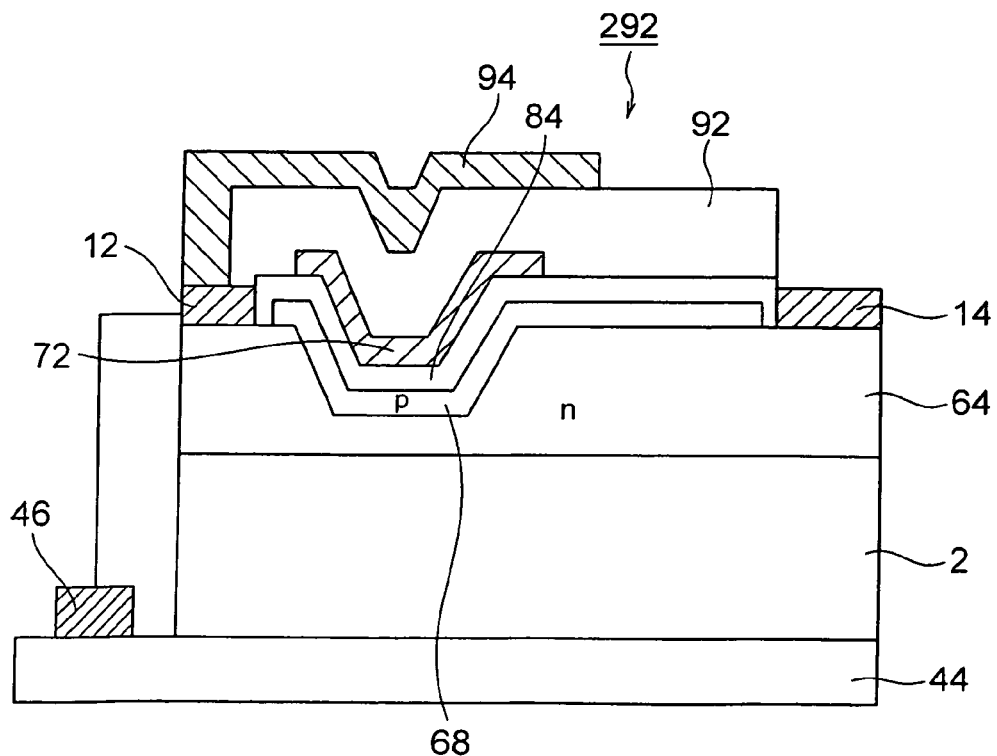
FIG. 22 is a sectional view schematically showing a modification of the semiconductor device shown in FIG. 21.

FIG. 22 shows a modification of the MIS-HFET 290 shown in FIG. 21. A MIS-HFET 292 comprises a hole absorption layer 44 formed of a p-type GaN layer beneath the channel layer 2 instead of the field plate structure disposed below the channel layer. Accordingly, the breakdown voltage is increased in the same manner as in the lower field plate structure, the holes can be quickly discharged, and it is also possible to increase the avalanche withstanding capability.

Ninth Embodiment

Figure 23:
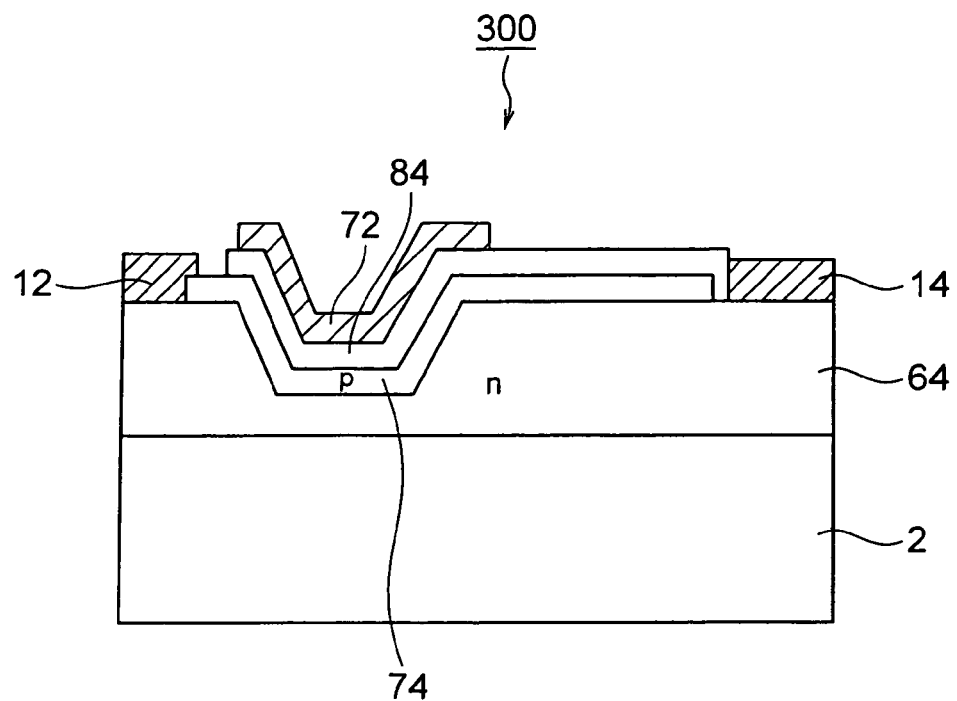
FIG. 23 is a sectional view schematically showing a ninth embodiment of a semiconductor device according to the present invention.

FIG. 23 is a sectional view schematically showing a constitution of a ninth embodiment of the semiconductor device according to the present invention.

Since the devices shown in FIGS. 16 to 22 have the MIS gate structure, the base layer is not connected to any electrode, and therefore each base layer becomes similar to a floating electrode. Therefore, when the electron is injected into the base layer and the hole is discharged from the base layer, the base layer remains to be charged.

A MIS-HFET 300 shown in FIG. 23 comprises a base layer 74 connected to the source electrode 12. By this structure, the carrier is quickly discharged when the base layer is charged. On the other hand, unlike the MIS-HFET 260 shown in FIG. 11, even when a base layer 74 is formed so as to coat the whole surface of the region between the source electrode 12 and the gate electrode 72, the barrier layer 64 other than the channel portion is thick, and therefore the resistance between gate and source does not increase, and the on-resistance does not increase.

Moreover, the base layer 74 is connected to the source electrode 12 in order to control the potential of the channel portion by the voltage added to the gate electrode 12, but the impurity concentration of the base layer 74 is preferably small to such an extent that the channel portion is depleted by the carrier of the thick barrier layer 64 between the gate and source.

Figure 24:
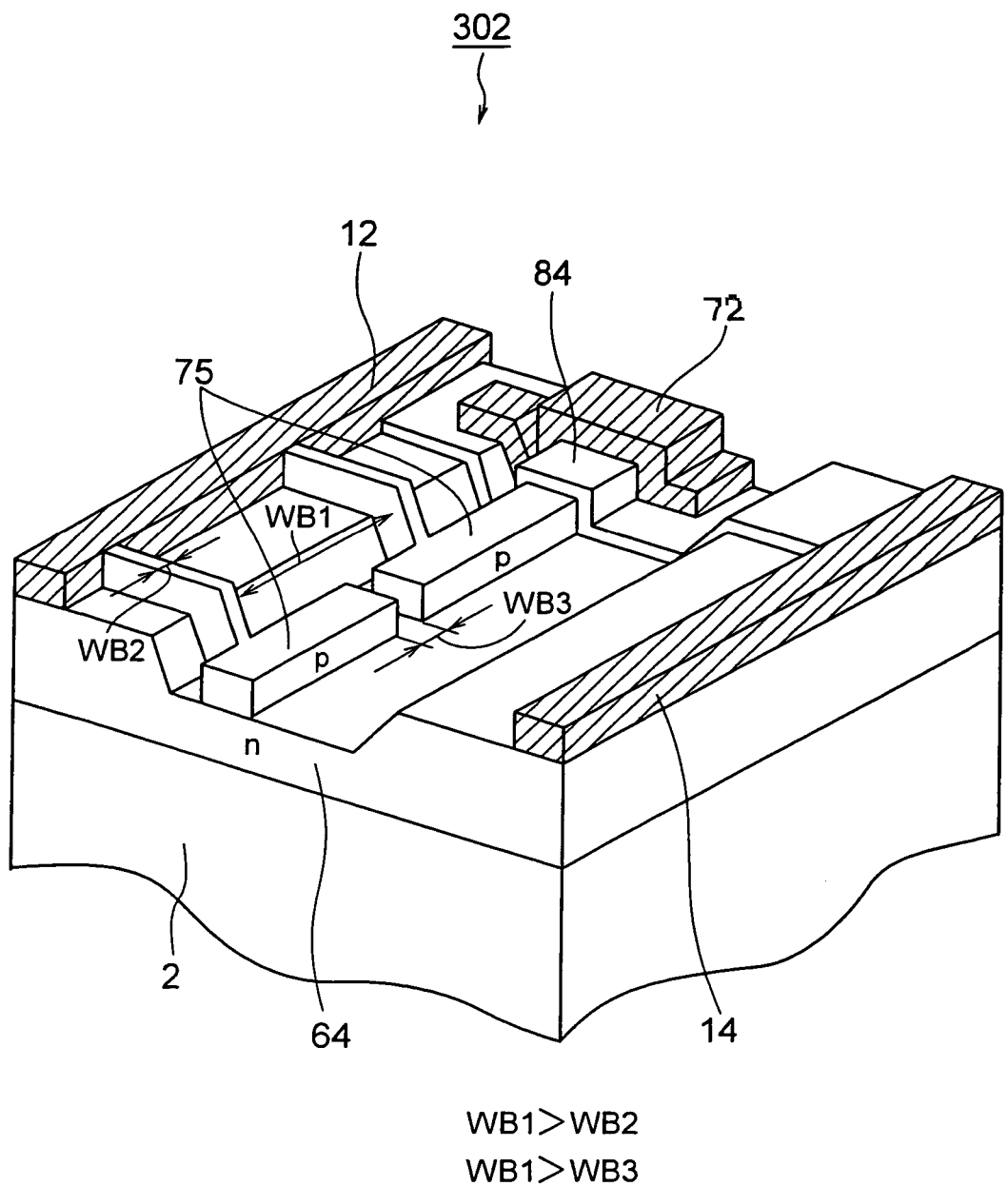
FIG. 24 is a perspective view schematically showing a modification of the semiconductor device shown in FIG. 23.

FIG. 24 is a perspective view schematically showing a modification of the MIS-HFET 300 shown in FIG. 23. According to a MIS-HFET 302 shown in FIG. 24, since a base layer 75 is locally formed right under the gate electrode 72, the impurity concentration of the p-base layer 75 is high in the same manner as in the MIS-HFET 260 shown in FIG. 12. Even when any strict concentration control is not performed, the device can be realized without any increase of the on-resistance or any change of the gate threshold voltage.

Moreover, also in the structures shown in FIGS. 23 and 24, the breakdown voltage can be increased, when the field plate electrode is additionally arranged. When the hole absorption layer is additionally provided, the avalanche withstanding capability can be increased.

Tenth Embodiment

Figure 25:
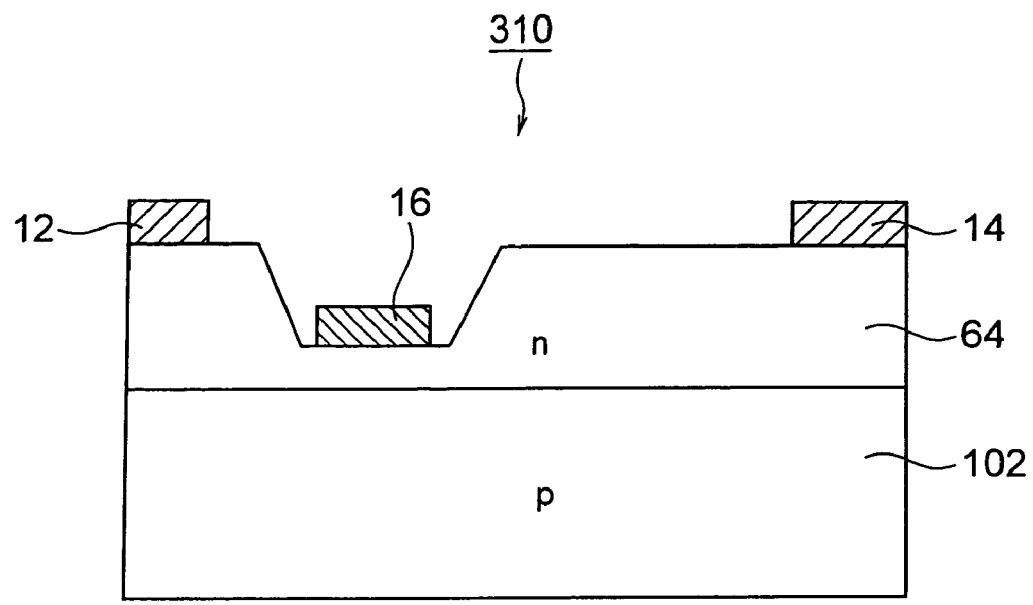
FIG. 25 is a sectional view schematically showing a tenth embodiment of a semiconductor device according to the present invention.

FIG. 25 is a sectional view schematically showing a constitution of a tenth embodiment of the semiconductor device according to the present invention.

The characteristics of an HFET 310 shown in FIG. 25 lie in that the transistor comprises a channel layer 102 formed of a p-type GaN layer and accordingly the gate threshold voltage shifts on a plus side. The channel layer 102 corresponds to, for example, a second conductivity type second semiconductor layer. Moreover, the barrier layer 64 has the recess gate structure in which only a region for the gate electrode is formed to be thin. Therefore, the 2DEG carrier concentration is reduced only in the region right under the gate electrode 16, and the normally-off state is easily realized. On the other hand, since the 2DEG carrier concentration is large in the offset portion between the gate and drain or between the gate and source, the on-resistance is small. The barrier layer 64 of the present embodiment corresponds to, for example, the first conductivity type or non-doped first semiconductor layer.

In this structure of the HFET 310, generation of a 2DEG carrier by piezo polarization in an AlGaN/GaN hetero interface cannot be inhibited as compared with a case where the p-GaN layer is disposed on the barrier layer 64 as in the HFET 270 shown in FIG. 13. Therefore, there is a disadvantage that the normally-off state is not realized unless the sheet impurity concentration of the p-type channel layer 102 is set to be further larger than that of the barrier layer 64 by a charge by the piezo polarization. However, the HFET 310 of the present embodiment does not require any step of re-growth after forming the recess gate, and therefore there is an advantage that the structure can be formed by one crystal growth.

Figure 26:
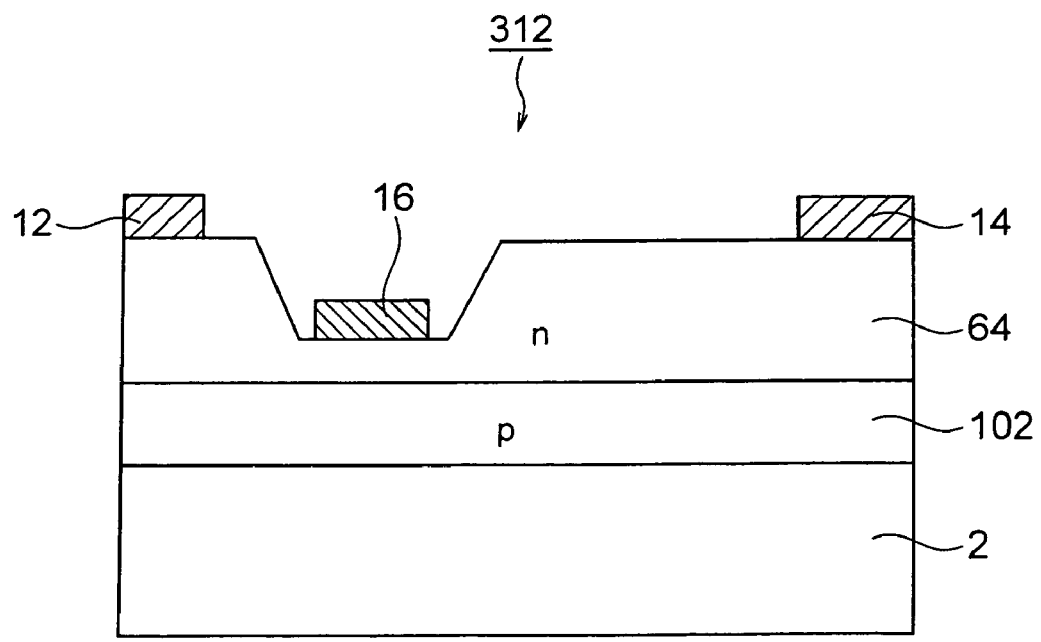
FIG. 26 is a sectional view schematically showing a first modification of the semiconductor device shown in FIG. 25.

FIG. 26 is a sectional view schematically showing a first modification of the HFET 310 shown in FIG. 25. An HFET 312 shown in the drawing further comprises the channel layer 2 formed of i-GaN under the p-type channel layer 102. Since the gate threshold voltage is determined by the sheet impurity concentrations of the barrier layer 64 and p-type channel layer 102, the p-type channel layer may be formed only in the vicinity of the hetero interface.

Figure 27:
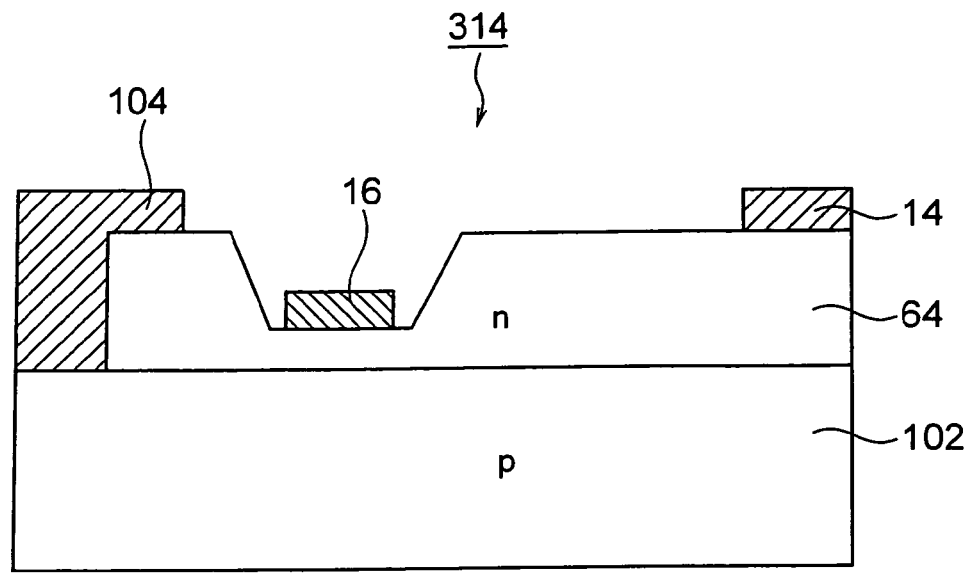
FIG. 27 is a sectional view schematically showing a second modification of the semiconductor device shown in FIG. 25.

FIG. 27 is a sectional view schematically showing a second modification of the HFET 310 shown in FIG. 25. The characteristics of an HFET 314 shown in the drawing lie in that the p-type channel layer 102 is connected to a source electrode 104. By this structure, since the hole generated at an avalanche breakdown is quickly discharged, the avalanche withstanding capability is increased. However, when the impurity concentration of the p-type channel layer 102 is excessively high in the structure shown in FIG. 27, the channel layer is not depleted when the voltage is applied, the avalanche breakdown occurs at a low voltage, and there is a possibility that the breakdown voltage drops. To solve the problem, it is preferable to use the structure in which the p-type channel layer 102 is also depleted so as to obtain a high breakdown voltage when the voltage is applied to the layer. Specifically, the sheet impurity concentration of the p-type channel layer 102 is set to be substantially equal to that of the barrier layer 64.

Figure 28:
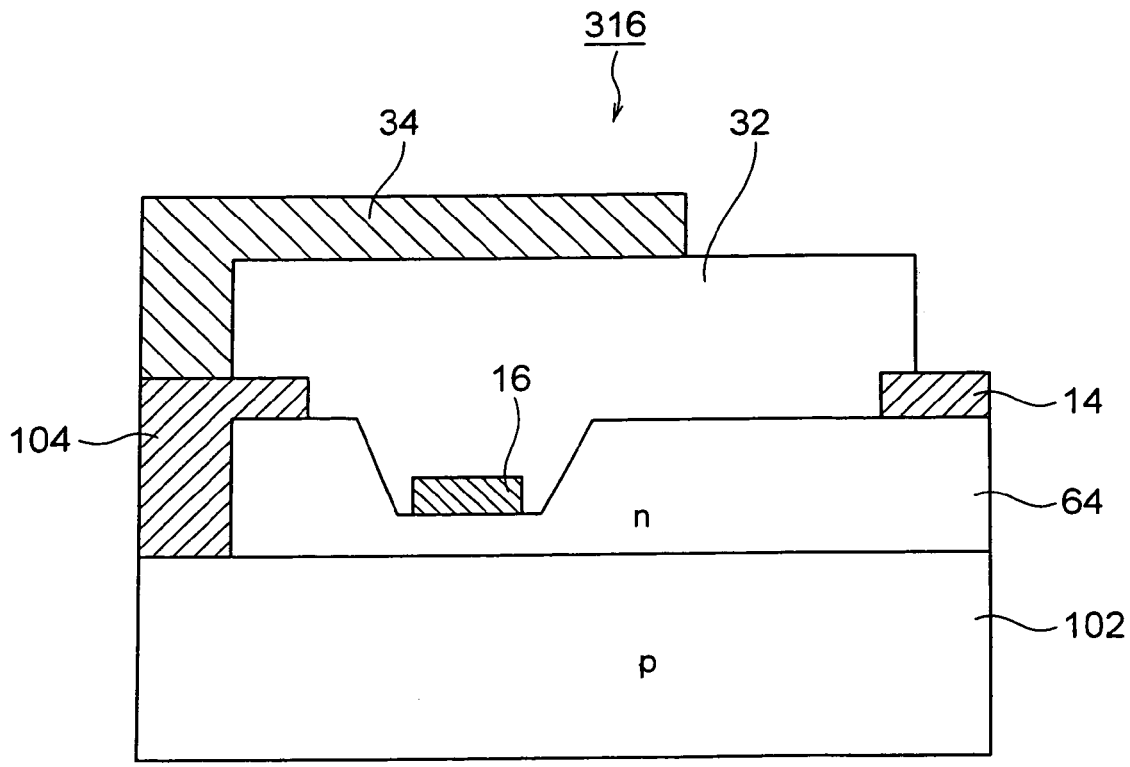
FIG. 28 is a sectional view schematically showing a third modification of the semiconductor device shown in FIG. 25.

FIG. 28 is a sectional view schematically showing a third modification of the HFET 310 shown in FIG. 25. In addition to the structure shown in FIG. 27, an HFET 316 shown in FIG.

Figure 29:
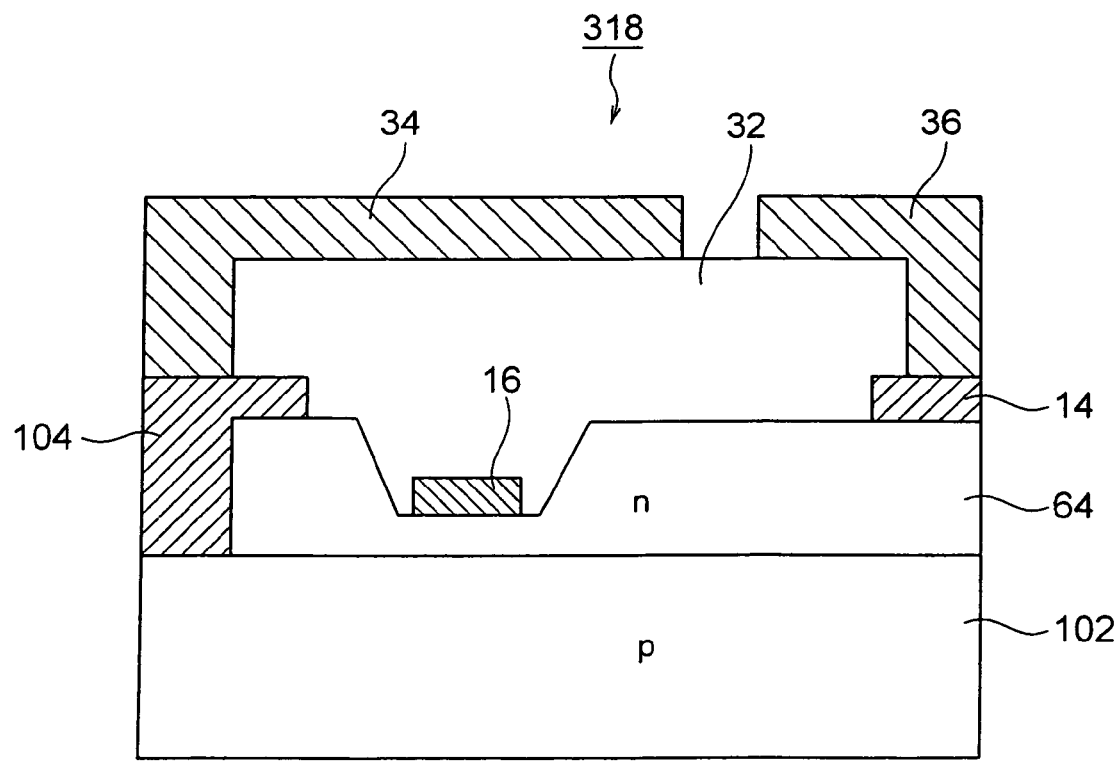
FIG. 29 is a sectional view schematically showing a fourth modification of the semiconductor device shown in FIG. 25.

28 further comprises a field plate electrode 34 which is formed so as to cover the gate electrode 16 via the field insulating film 32 and which is connected to the source electrode 104. By this structure, since the electric field in the end portion of the gate electrode 16 is defused, it is possible to increase the breakdown voltage of the device. Furthermore, even when the field plate electrode 36 is additionally disposed on the drain side on the field insulating film 32 as in an HFET 318 shown in FIG. 29, it is possible to further increase the breakdown voltage.

Eleventh Embodiment

Figure 30:
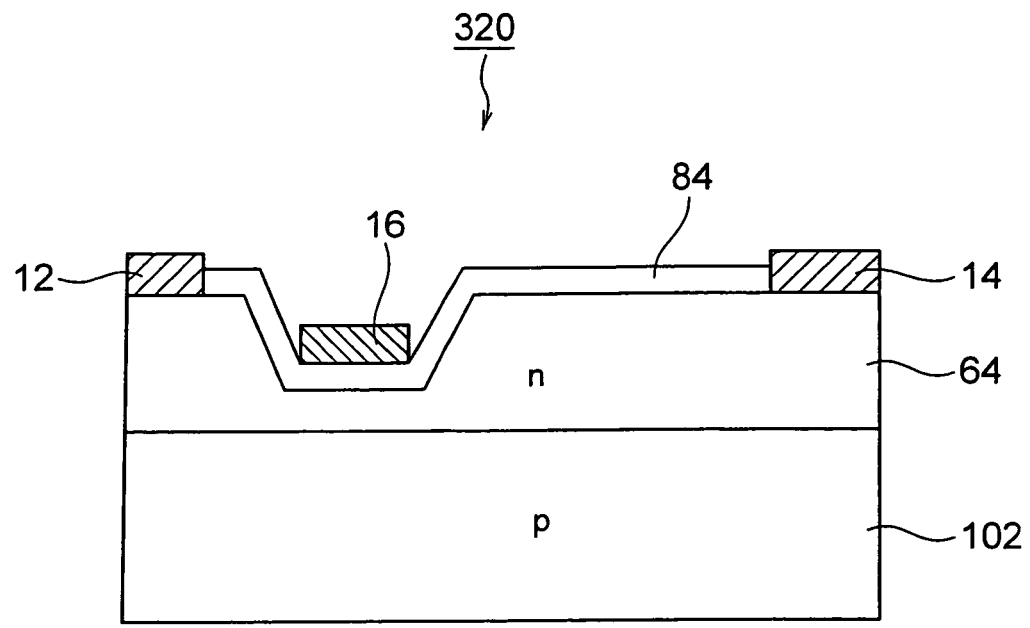
FIG. 30 is a sectional view schematically showing an eleventh embodiment of a semiconductor device according to the present invention.
Figure 31:
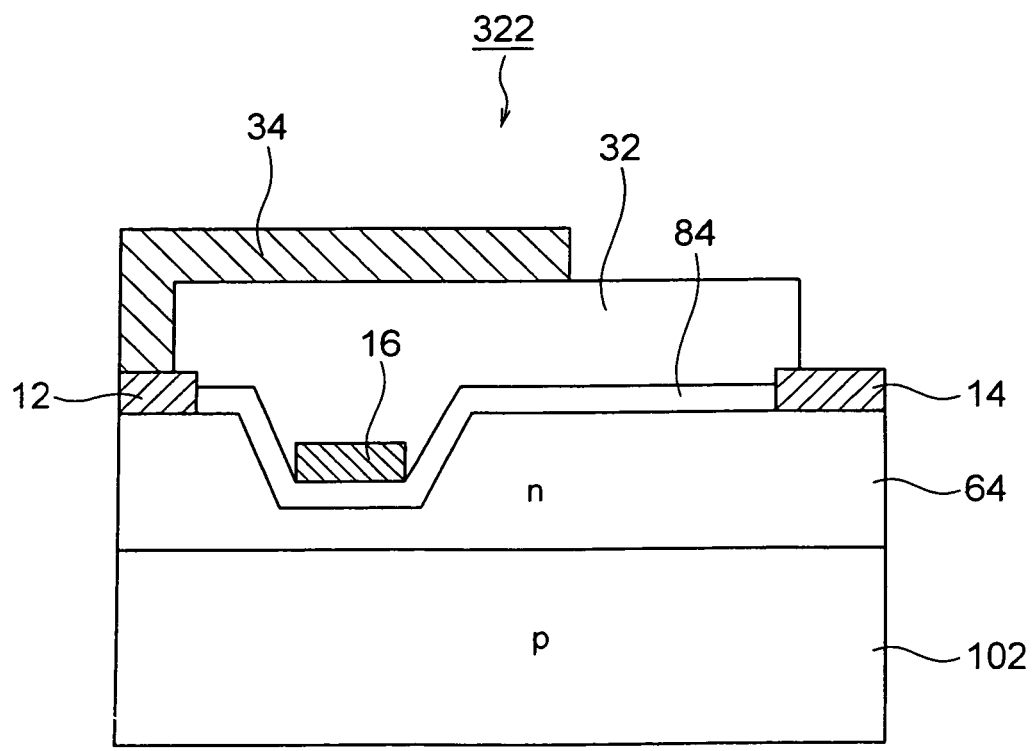
FIG. 31 is a sectional view schematically showing a first modification of the semiconductor device shown in FIG. 30.
Figure 32:
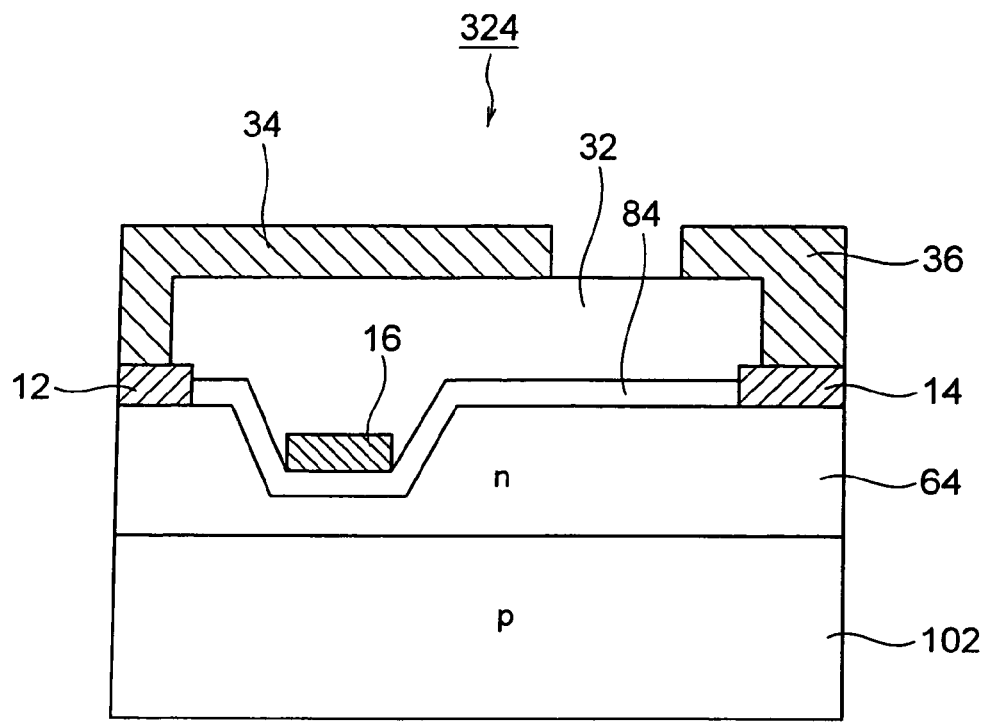
FIG. 32 is a sectional view schematically showing a second modification of the semiconductor device shown in FIG. 30.

FIG. 30 is a sectional view schematically showing a constitution of an eleventh embodiment of the semiconductor device according to the present invention. The characteristics of a MIS-HFET 320 shown in the drawing lie in that the transistor further comprises a gate insulating film 84 formed on the surface of the barrier layer 64 and that the gate electrode 16 is formed in a concave portion of the barrier layer 64 via the gate insulating film 84. The present invention is also applicable to such MIS gate structure. Furthermore, when the field plate electrode 34 is disposed so as to cover the gate electrode 16 via the field insulating film 32 as in modifications 322 and 324 shown in FIGS. 31 and 32, respectively, a field concentration in the end of the source electrode 12 or the drain electrode 14 is defused, and it is possible to further increase the breakdown voltage.

Figure 33:
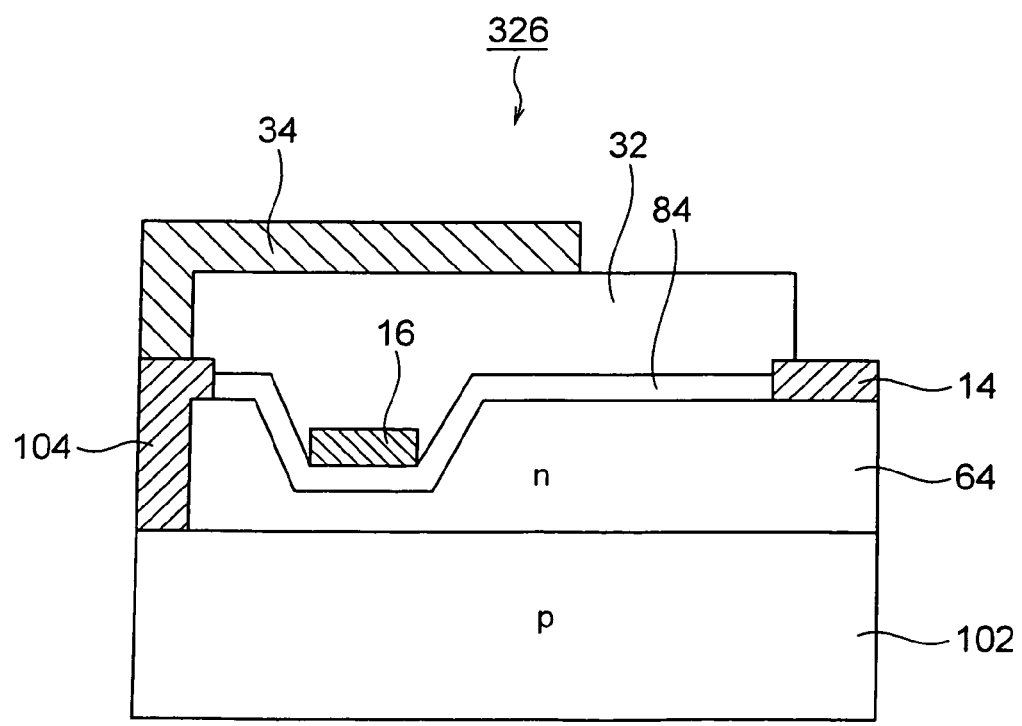
FIG. 33 is a sectional view schematically showing a third modification of the semiconductor device shown in FIG. 30.

Furthermore, when the p-type channel layer 102 is connected to the source electrode 104 as in a MIS-HFET 326 shown in FIG. 33, the hole can be quickly discharged, and it is therefore possible to increase the avalanche withstanding capability.

The first to eleventh embodiments of the present invention have been described above, but the present invention is not limited to the above-described embodiments, and any person skilled in the art can easily devise various other modifications within the scope of the present invention.

For example, the channel layer 2, base layer 6, and buffer layer 8 have been described using the GaN layer, but an AlGaN layer can be implemented, when an equal Al composition ratio is set to each of three layers, and set to be smaller than that of the barrier layer 4. Moreover, with respect to the Al composition ratio of the buffer layer 8, the channel layer 2 is equal to the base layer 6, but different composition ratios may also be used. However, the Al composition ratio of the buffer layer 8 is preferably equal to that of the channel layer 2 in order to cancel the piezo polarization in the hetero interface between the barrier layer 4 and the channel layer 2 and to lower the 2DEG carrier concentration under the gate electrode.

Moreover, the invention can be implemented as long as a relation between band gaps is the same even when the band gaps are changed by a composition ratio such as a case where an InGaN layer is used for the channel layer and a GaN layer is used for the barrier layer and a case where an AlGaN layer is used for the channel layer and an AlN layer is used for the barrier layer.

Furthermore, an i-AlGaN layer may also be inserted between the channel layer 2 and the barrier layer 4 or between the barrier layer 4 and the base layer 6 in order to keep steepness of modulation doping or hetero interface.

Additionally, the semiconductor layers such as the channel layer and barrier layer may be formed by the crystal growth on the substrate, and may be implemented with substrates such as GaN, SiC, sapphire, and Si, but the present invention is not limited to the material of the substrate, and a buffer layer or the like involved by the crystal growth may also be formed under the channel layer.

Moreover, in the present invention, a threshold voltage can be shifted on a plus side even in a normally-on device by forming the GaN layer on the AlGaN barrier layer for the purpose of realizing the normally-off state. Especially, the Al composition ratio of the base layer 6 is equal to that of the channel layer 2. However, in a meaning that the carrier by the piezo polarization is reduced, even when the Al composition ratio is not equal, the present invention may be implemented with an Al composition ratio smaller than that of the barrier layer 4.

What is claimed is:

1. A semiconductor device comprising:
   a first semiconductor layer represented by a composition formula $Al_xGa_{1-x}N$ ($0 \leq x \leq 1$);
   a first conductivity type or non-doped second semiconductor layer represented by a composition formula $Al_yGa_{1-y}N$ ($0 \leq y \leq 1$, x<y), formed on the first semiconductor layer and having a concave portion;
   a second conductivity type third semiconductor layer represented by a composition formula $Al_xGa_{1-x}N$ ($0 \leq x \leq 1$) and is selectively formed above a bottom surface of the concave portion of the second semiconductor layer;
   a gate electrode formed on the third semiconductor layer;
   a source electrode electrically connected to the second semiconductor layer; and
   a drain electrode electrically connected to the second semiconductor layer,
   wherein the third semiconductor layer is formed so as to coat the bottom surface of the concave portion, a side surface of the concave portion and a surface of a portion of the second semiconductor layer which is thicker than the concave portion.

2. The semiconductor device according to claim 1, wherein the third semiconductor layer is formed so as to coat at least half a surface region of the second semiconductor layer between the gate electrode and the drain electrode.

3. The semiconductor device according to claim 1, which further comprises a gate insulating film formed so as to be sandwiched by the third semiconductor layer and the gate electrode.

4. A semiconductor device comprising:
   a first semiconductor layer represented by a composition formula $Al_xGa_{1-x}N$ ($0 \leq x \leq 1$);
   a first conductivity type or non-doped second semiconductor layer represented by a composition formula $Al_yGa_{1-y}N$ ($0 \leq y \leq 1$, x<y), formed on the first semiconductor layer and having a concave portion;
   a second conductivity type third semiconductor layer represented by a composition formula $Al_xGa_{1-x}N$ ($0 \leq x \leq 1$) and is selectively formed above a bottom surface of the concave portion of the second semiconductor layer;
   a gate electrode formed on the third semiconductor layer;
   a source electrode electrically connected to the second semiconductor layer; and
   a drain electrode electrically connected to the second semiconductor layer,
   wherein the third semiconductor layer is formed so as to extend to contact the source electrode through the side surface of the concave portion.

* * * * *